United States Patent
Park et al.

(10) Patent No.: US 12,453,172 B2
(45) Date of Patent: Oct. 21, 2025

(54) SEMICONDUCTOR DEVICE INCLUDING FIN FIELD EFFECT TRANSISTOR WITH SEPARATION LAYER

(71) Applicant: SAMSUNG ELECTRONICS CO., LTD., Suwon-si (KR)

(72) Inventors: Seonghwa Park, Seoul (KR); Hongbae Park, Seoul (KR); Jaehyun Lee, Hwaseong-si (KR); Jonghan Lee, Namyangju-si (KR); Dabok Jeong, Hwaseong-si (KR); Minseok Jo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 66 days.

(21) Appl. No.: 17/705,565

(22) Filed: Mar. 28, 2022

(65) Prior Publication Data
US 2022/0223592 A1  Jul. 14, 2022

Related U.S. Application Data

(63) Continuation of application No. 16/382,439, filed on Apr. 12, 2019, now Pat. No. 11,289,478.

(30) Foreign Application Priority Data

Sep. 6, 2018  (KR) .................. 10-2018-0106428

(51) Int. Cl.
*H10D 84/83*    (2025.01)
*H01L 21/308*   (2006.01)
(Continued)

(52) U.S. Cl.
CPC ....... *H10D 84/834* (2025.01); *H01L 21/3086* (2013.01); *H10D 30/024* (2025.01); (Continued)

(58) Field of Classification Search
CPC ............. H01L 27/0886; H01L 21/3086; H01L 21/823431; H01L 21/823437; (Continued)

(56) References Cited

U.S. PATENT DOCUMENTS 6,495,422 B1  12/2002  Yu et al.
8,685,820 B2  4/2014   Tseng et al.
(Continued)

FOREIGN PATENT DOCUMENTS

CN  106158966  11/2016
CN  106910738  6/2017
(Continued)

*Primary Examiner* — Su C Kim
(74) *Attorney, Agent, or Firm* — Fish & Richardson P.C.

(57) ABSTRACT

A semiconductor device includes a first gate pattern and a second gate pattern on a substrate, the first gate pattern and the second gate pattern being spaced apart from each other, and a separation pattern that separates the first gate pattern and the second gate pattern from each other. The first gate pattern includes a first high-k dielectric pattern and a first metal-containing pattern on the first high-k dielectric pattern, the first metal-containing pattern covering a sidewall of the first high-k dielectric pattern. The second gate pattern includes a second high-k dielectric pattern and a second metal-containing pattern on the second high-k dielectric pattern, and the separation pattern is in direct contact with the first metal-containing pattern and spaced apart from the first high-k dielectric pattern.

12 Claims, 30 Drawing Sheets

(51) Int. Cl.
*H10D 30/01* (2025.01)
*H10D 30/62* (2025.01)
*H10D 62/10* (2025.01)
*H10D 64/01* (2025.01)
*H10D 84/01* (2025.01)
*H10D 84/03* (2025.01)

(52) U.S. Cl.
CPC .......... *H10D 30/62* (2025.01); *H10D 62/115* (2025.01); *H10D 64/017* (2025.01); *H10D 84/0135* (2025.01); *H10D 84/0151* (2025.01); *H10D 84/0158* (2025.01); *H10D 84/038* (2025.01)

(58) Field of Classification Search
CPC ......... H01L 21/823481; H01L 29/0649; H01L 29/66545; H01L 29/66795; H01L 29/785; H01L 21/82345; H01L 21/823462
See application file for complete search history.

(56) References Cited

U.S. PATENT DOCUMENTS

| | | | |
|---|---|---|---|
| 8,729,633 B2 | 5/2014 | Li | |
| 8,912,607 B2 | 12/2014 | Kwon et al. | |
| 9,331,074 B1 | 5/2016 | Chang et al. | |
| 9,899,267 B1 | 2/2018 | Liou et al. | |
| 9,911,736 B1* | 3/2018 | Zang | H01L 21/31053 |
| 10,014,304 B2 | 7/2018 | Park et al. | |
| 10,038,079 B1 | 7/2018 | Ohtou et al. | |
| 10,056,289 B1 | 8/2018 | Cheng et al. | |
| 10,157,746 B2 | 12/2018 | Hsieh | |
| 10,395,990 B2 | 8/2019 | Lee et al. | |
| 10,483,370 B2 | 11/2019 | Chang et al. | |
| 10,553,700 B2* | 2/2020 | Bao | H01L 21/823821 |
| 10,879,374 B2 | 12/2020 | Yu et al. | |
| 11,107,813 B2 | 8/2021 | Lin | |
| 2007/0210354 A1 | 9/2007 | Nabatame et al. | |
| 2008/0116530 A1 | 5/2008 | Hyun et al. | |
| 2013/0270644 A1* | 10/2013 | Anderson | H01L 21/823481 257/E21.546 |
| 2015/0014780 A1 | 1/2015 | Kim et al. | |
| 2016/0056181 A1 | 2/2016 | Anderson et al. | |
| 2016/0133632 A1 | 5/2016 | Park et al. | |
| 2016/0247728 A1* | 8/2016 | You | H01L 21/823807 |
| 2016/0276340 A1 | 9/2016 | Chang et al. | |
| 2016/0336320 A1 | 11/2016 | Lin | |
| 2017/0033107 A1* | 2/2017 | Hong | H01L 27/0924 |
| 2017/0103986 A1 | 4/2017 | Kim et al. | |
| 2017/0110582 A1* | 4/2017 | Chang | H01L 29/66545 |
| 2017/0117275 A1 | 4/2017 | Shen et al. | |
| 2017/0125411 A1* | 5/2017 | Yu | H10D 84/834 |
| 2017/0148682 A1 | 5/2017 | Basker et al. | |
| 2017/0256457 A1 | 9/2017 | Deng et al. | |

FOREIGN PATENT DOCUMENTS

| | | |
|---|---|---|
| CN | 108074975 | 5/2018 |
| JP | 2014-229750 A | 12/2014 |
| KR | 10-2003-0050678 A | 6/2003 |
| KR | 10-2004-0108488 A | 12/2004 |
| KR | 10-2016-0056693 | 5/2016 |
| KR | 10-2017-0052433 A | 5/2017 |
| KR | 10-2017-0095174 A | 8/2017 |

* cited by examiner

SEMICONDUCTOR DEVICE INCLUDING FIN FIELD EFFECT TRANSISTOR WITH SEPARATION LAYER

CROSS-REFERENCE TO RELATED APPLICATION

This application is a continuation of U.S. patent application Ser. No. 16/382,439 filed Apr. 12, 2019, which is incorporated by reference herein in its entirety.

Korean Patent Application No. 10-2018-0106428, filed on Sep. 6, 2018, in the Korean Intellectual Property Office, and entitled: "Semiconductor Device and Method of Manufacturing the Same," is incorporated by reference herein in its entirety.

BACKGROUND

1. Field

The present disclosure relates to a semiconductor device, and more particularly, to a semiconductor device including a fin field effect transistor and a method of manufacturing the same.

2. Description of the Related Art

A semiconductor device may include an integrated circuit with metal oxide semiconductor field effect transistors (MOSFETs). As size and design rule of the semiconductor device are gradually decreased, sizes of the MOSFETs are also scaled down. The scale down of MOSFETs may deteriorate operating characteristics of the semiconductor device. Accordingly, various researches have been developed to manufacture semiconductor devices having superior performances while overcoming limitations due to high integration of the semiconductor devices.

SUMMARY

According to some example embodiments, a semiconductor device may include a first gate pattern and a second gate pattern that are disposed on a substrate and spaced apart from each other, and a separation pattern that separates the first gate pattern and the second gate pattern from each other. The first gate pattern may comprise a first high-k dielectric pattern and a first metal-containing pattern on the first high-k dielectric pattern. The first metal-containing pattern may cover a sidewall of the first high-k dielectric pattern. The second gate pattern may comprise a second high-k dielectric pattern and a second metal-containing pattern on the second high-k dielectric pattern. The separation pattern may be in direct contact with the first metal-containing pattern and spaced apart from the first high-k dielectric pattern.

According to some example embodiments, a semiconductor device may include a plurality of first active fins that protrude from a substrate, a plurality of second active fins that protrude from the substrate and are spaced apart from the first active fins, a first gate pattern that crosses over the first active fins and is elongated in a first direction, a second gate pattern that crosses over the second active fins and is elongated in the first direction, and a separation pattern between the first gate pattern and the second gate pattern. The first gate pattern may comprise a first high-k dielectric pattern. The separation pattern may be spaced apart from the first high-k dielectric pattern.

According to some example embodiments, a semiconductor device may include a substrate including a first gate region, a second gate region, and a separation region between the first and second gate regions, and a first gate pattern and a second gate pattern that are provided on the substrate and respectively disposed on the first gate region and the second gate region. The first gate pattern may comprise a first high-k dielectric pattern. The first high-k dielectric pattern may not be exposed at a sidewall of the first gate pattern. The sidewall of the first gate pattern may be adjacent to the separation region.

According to some example embodiments, a method of manufacturing a semiconductor device may include providing a substrate including a first gate region, a second gate region, and a separation region between the first and second gate regions, forming a high-k dielectric layer on an entire surface of the substrate; removing the high-k dielectric layer from the separation region to form a first high-k dielectric pattern and a second high-k dielectric pattern on the first gate region and the second gate region, respectively, forming a metal-containing layer on the entire surface of the substrate, and removing the metal-containing layer from the separation region to form a first gate pattern and a second gate pattern on the first gate region and the second gate region, respectively.

BRIEF DESCRIPTION OF THE DRAWINGS

Features will become apparent to those of skill in the art by describing in detail exemplary embodiments with reference to the attached drawings, in which.

DETAILED DESCRIPTION

Some example embodiments will now be described in detail with reference to the accompanying drawings.

Figure 1:
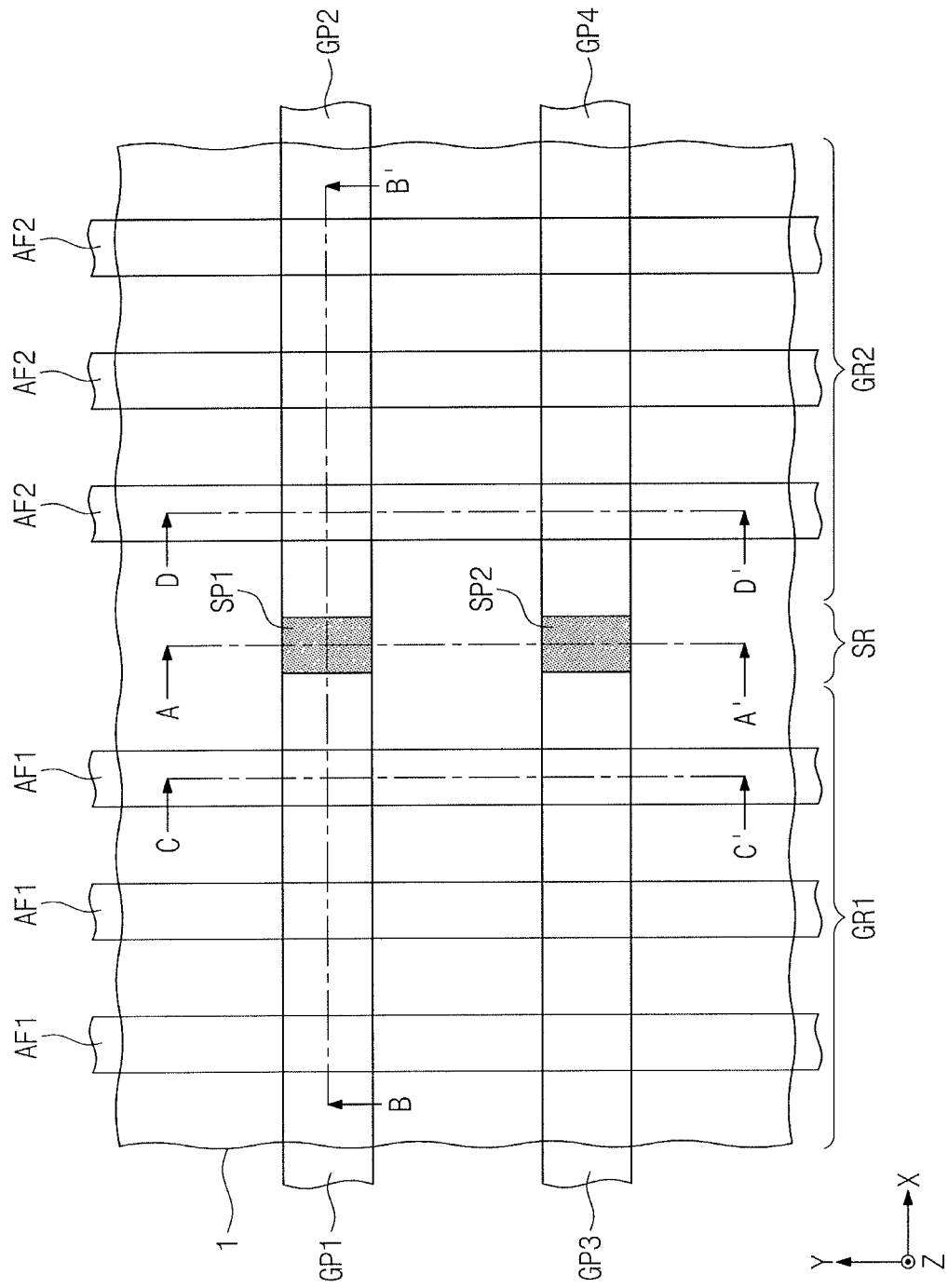
FIG. 1 illustrates a plan view of a semiconductor device according to some example embodiments.
Figure 2:
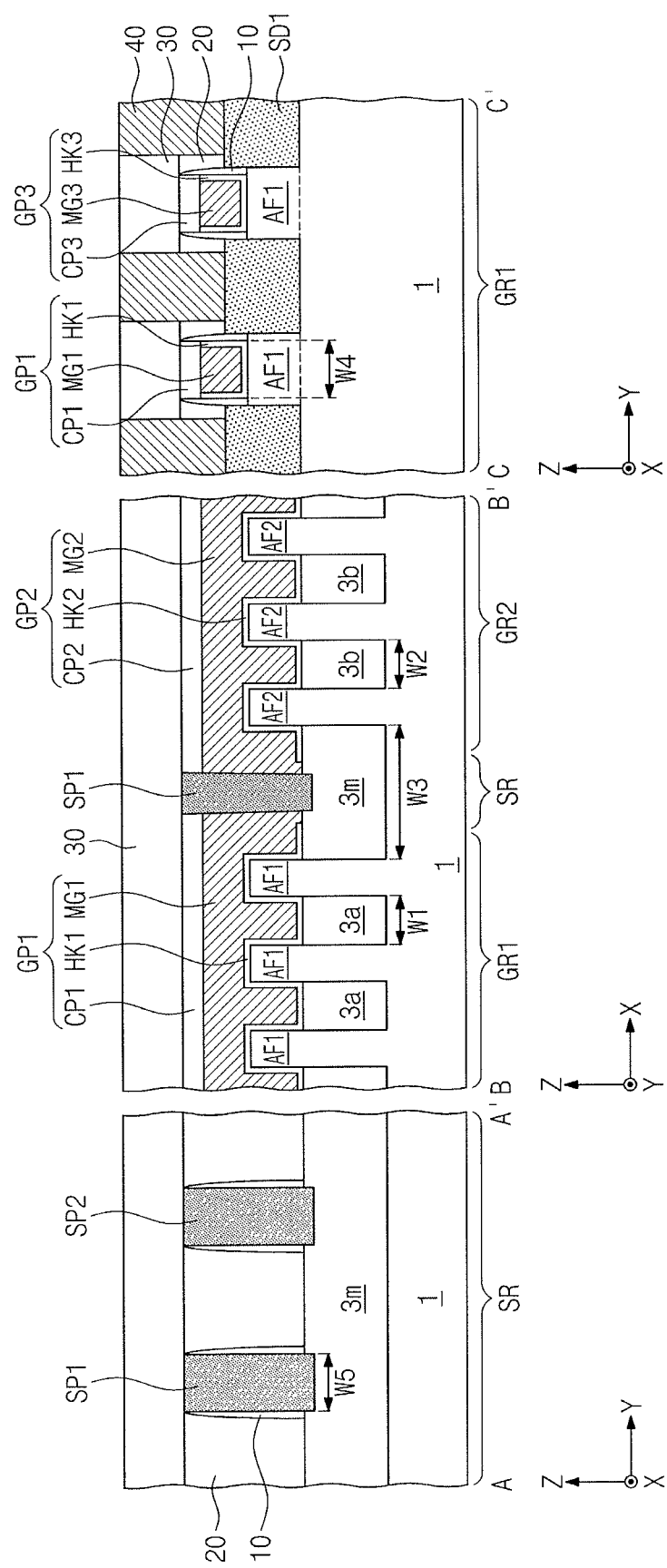
FIG. 2 illustrates a cross-sectional view along lines A-A', B-B', C-C' of FIG. 1, according to example embodiments.
Figure 3:
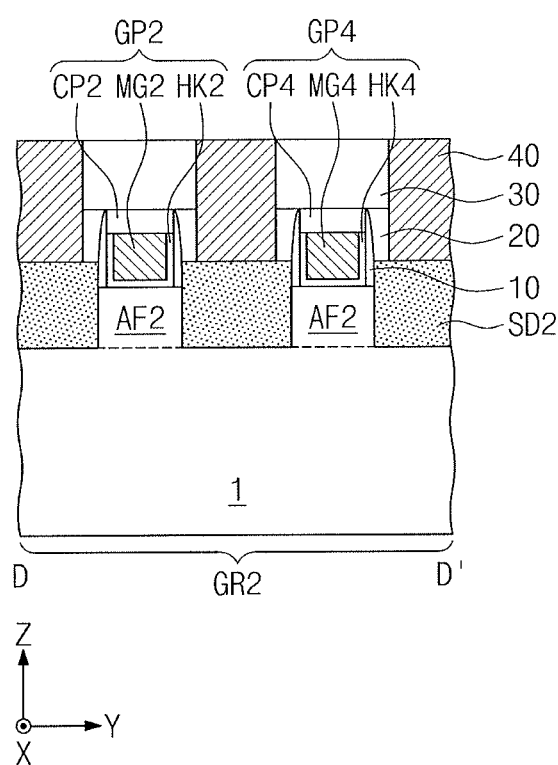
FIG. 3 illustrates a cross-sectional view along line D-D' of FIG. 1.

FIG. 1 illustrates a plan view showing a semiconductor device according to some example embodiments. FIG. 2 illustrates a cross-sectional view taken along lines A-A', B-B', C-C' of FIG. 1, according to some example embodiments. FIG. 3 illustrates a cross-sectional view taken along line D-D' of FIG. 1, according to some example embodiments.

Referring to FIGS. 1 to 3, a semiconductor substrate 1 may include a first gate region GR1 and a second gate region GR2 that are spaced apart from each other, e.g., along a first direction X, and also include a separation region SR between the first and second gate regions GR1 and GR2. The semiconductor substrate 1 may be, e.g., a single crystalline silicon wafer substrate or a silicon-on-insulator (SOI) substrate. A plurality of first active fins AF1 and a plurality of second active fins AF2 may protrude in a third direction Z from a top surface of the semiconductor substrate 1. The first active fins AF1 may be disposed on the first gate region GR1, and the second active fins AF2 may be disposed on the second gate region GR2.

A first gate pattern GP1 and a third gate pattern GP3 may cross over the first active fins AF1, e.g., the first and third gate patterns GP1 and GP3 may be parallel to each other and spaced apart from each other along a second direction Y. A second gate pattern GP2 and a fourth gate pattern GP4 may cross over the second active fins AF2, e.g., the second and fourth gate patterns GP2 and GP4 may be parallel to each other and spaced apart from each other along the second direction Y. The first, second, third, and fourth gate patterns GP1, GP2, GP3, and GP4 may be elongated in the first direction X. The first gate pattern GP1 may be adjacent to and spaced apart from the second gate pattern GP2, e.g., along the first direction X. The first and second gate patterns GP1 and GP2 may be placed on an imaginary straight line. The third gate pattern GP3 may be adjacent to and spaced apart from the fourth gate pattern GP4, e.g., along the first direction X. The third and fourth gate patterns GP3 and GP4 may be placed on an imaginary straight line.

Each of the first and second active fins AF1 and AF2 may have a linear or bar shape that extends in the second direction Y intersecting the first direction X. The semiconductor device may be a fin field effect transistor.

First device isolation patterns 3a may be disposed on the semiconductor substrate 1 between the first active fins AF1. Second device isolation patterns 3b may be disposed on the semiconductor substrate 1 between the second active fins AF2. A third device isolation pattern 3m may be disposed on the semiconductor substrate 1 between one of the first active fins AF1 that is most adjacent to the second gate pattern GP2 and one of the second active fins AF2 that is most adjacent to the first gate pattern GP1. The first, second, and third device isolation patterns 3a, 3b, and 3m may have their top surfaces lower than those of the first and second active fins AF1 and AF2. The first, second, and third device isolation patterns 3a, 3b, and 3m may have a single- or multi-layered structure that includes, e.g., one or more of a silicon oxide layer, a silicon nitride layer, and a silicon oxynitride layer.

The first active fins AF1 may be spaced apart from each other, e.g., along the first direction X, at an interval corresponding to a first width W1 of each of the first device isolation patterns 3a. The second active fins AF2 may be spaced apart from each other, e.g., along the first direction X, at an interval corresponding to a second width W2 of each of the second device isolation patterns 3b. The third device isolation pattern 3m may have a third width W3, e.g., along the first direction X, corresponding to a distance between one of the first active fins AF1 that is most adjacent to the second gate pattern GP2 and one of the second active fins AF2 that is most adjacent to the first gate pattern GP1. The first width W1 may be substantially the same as the second width W2. The third width W3 may be greater than the first and second widths W1 and W2.

The first and third gate patterns GP1 and GP3 may be in contact with the top surfaces and lateral surfaces of the first active fins AF1 and with the top surfaces of the first device isolation patterns 3a. The second and fourth gate patterns GP2 and GP4 may be in contact with the top surfaces and lateral surfaces of the second active fins AF2 and with the top surfaces of the second device isolation patterns 3b.

The first gate pattern GP1 may include a first high-k dielectric pattern HK1, a first metal-containing pattern MG1, and a first capping pattern CP1. The second gate pattern GP2 may include a second high-k dielectric pattern HK2, a second metal-containing pattern MG2, and a second capping pattern CP2. The third gate pattern GP3 may include a third high-k dielectric pattern HK3, a third metal-containing pattern MG3, and a third capping pattern CP3. The fourth gate pattern GP4 may include a fourth high-k dielectric pattern HK4, a fourth metal-containing pattern MG4, and a fourth capping pattern CP4.

The first, second, third, and fourth high-k dielectric patterns HK1, HK2, HK3, and HK4 may be formed of a material, whose dielectric constant is greater than that of a silicon oxide layer, including one or more of, e.g., hafnium oxide ($HfO_2$), hafnium silicate (HfSiO), hafnium oxynitride (HfON), hafnium silicon oxynitride (HfSiON), hafnium aluminum oxide ($HfAlO_3$), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), titanium oxide ($TiO_2$), barium strontium titanium oxide (BaSrTiO), barium titanium oxide (BaTiO), strontium titanium oxide (SrTiO), yttrium oxide (YO), aluminum oxide ($Al_2O_3$), tantalum oxide ($Ta_2O_3$), and lead scandium tantalum oxide (PbScTaO).

Each of the first, second, third, and fourth gate patterns GP1, GP2, GP3, and GP4 may further include a dielectric layer between a corresponding one of the first, second, third, and fourth high-k dielectric patterns HK1, HK2, HK3, and HK4 and a corresponding one of the first and second active fins AF1 and AF2. The dielectric layer may have a single- or multi-layered structure that includes, e.g., one or more of a silicon oxide layer, a silicon oxynitride layer, and a silicon nitride layer. The first, second, third, and fourth high-k dielectric patterns HK1, HK2, HK3, and HK4 and the dielectric layer may serve as gate dielectric layers.

Each of the first, second, third, and fourth metal-containing patterns MG1, MG2, MG3, and MG4 may include one or more of a work function pattern, diffusion break pattern, and a metal line pattern. The work function pattern may be an N-type work function pattern or a P-type work function pattern. The N-type work function pattern may include, e.g., one or more of lanthanum (La), lanthanum oxide (LaO), tantalum (Ta), tantalum nitride (TaN), niobium (Nb), and titanium nitride (TiN). The P-type work function pattern may include, e.g., one or more of aluminum (Al), aluminum oxide ($Al_2O_3$), titanium nitride (TiN), tungsten nitride (WN), and ruthenium oxide ($RuO_2$). The diffusion break pattern may include a metal nitride layer, e.g., a titanium nitride layer, a tantalum nitride layer, and a tungsten nitride layer. The metal line pattern may include one or more of, e.g., tungsten, copper, and aluminum.

Referring to a cross-section taken along line B-B' in FIG. 2, the first gate pattern GP1 may be configured such that the first metal-containing pattern MG1 contact a sidewall of the first high-k dielectric pattern HK1. The first metal-containing pattern MG1 may be in partial contact with the top surface of the third device isolation pattern 3m. The second gate pattern GP2 may be configured such that the second metal-containing pattern MG2 may be in contact with a sidewall of the second high-k dielectric pattern HK2. The second metal-containing pattern MG2 may be in partial contact with the top surface of the third device isolation pattern 3m. Each of the third and fourth gate patterns GP3 and GP4 may have a cross-section parallel to the first and second gate patterns GP1 and GP2 in the first direction X, and may have structures the same as or similar to the cross-section taken along line B-B' in FIG. 2.

Referring to a cross-section taken along line C-C' shown in FIG. 2, the first high-k dielectric pattern HK1 may extend to cover a sidewall of the first metal-containing pattern MG1. The third high-k dielectric pattern HK3 may extend to cover a sidewall of the third metal-containing pattern MG3. As shown in FIG. 3, the second high-k dielectric pattern HK2 may extend to cover a sidewall of the second metal-containing pattern MG2. The fourth high-k dielectric pattern HK4 may extend to cover a sidewall of the fourth metal-containing pattern MG4.

In the cross-section taken along line B-B' in FIG. 2, a first separation pattern SP1 may be interposed between the first gate pattern GP1 and the second gate pattern GP2. A second separation pattern SP2 may be interposed between the third gate pattern GP3 and the fourth gate pattern GP4. The first and second separation patterns SP1 and SP2 may include a single or multiple layer of dielectric, e.g., silicon oxide, silicon nitride, and silicon oxynitride. The first separation pattern SP1 may be in contact with the first metal-containing pattern MG1 and the first capping pattern CP1, and may be spaced apart from the first high-k dielectric pattern HK1. The first metal-containing pattern MG1 may be interposed between the first separation pattern SP1 and the sidewall of the first high-k dielectric pattern HK1. The first separation pattern SP1 may be in contact with the second metal-containing pattern MG2 and the second capping pattern CP2, and may be spaced apart from the second high-k dielectric pattern HK2. The first separation pattern SP1 may be in contact with both the first metal-containing pattern MG1 and the second metal-containing pattern MG2.

The first high-k dielectric pattern HK1 may not be exposed at a sidewall of the first gate pattern GP1, which sidewall is on or adjacent to the separation region SR. The second high-k dielectric pattern HK2 may not be exposed at a sidewall of the second gate pattern GP2, which sidewall is on or adjacent to the separation region SR. The sidewall of the first high-k dielectric pattern HK1 may not be aligned with the sidewall of the first metal-containing pattern MG1. The sidewall of the second high-k dielectric pattern HK2 may not be aligned with the sidewall of the second metal-containing pattern MG2. For example, as illustrated in FIG. 2, while the first high-k dielectric pattern HK1 may be, e.g., continuous and, conformal on the first active fins AF1 and the first device isolation pattern 3a therebetween, the first high-k dielectric pattern HK1 may extend only on a portion of the third device isolation pattern 3m, so a portion of the third device isolation pattern 3m may be exposed, e.g., not covered, by the first high-k dielectric pattern HK1, e.g., a portion of the third device isolation pattern 3m surrounding the first separation pattern SP1, may be covered by the first metal-containing pattern MG1, e.g., so the first metal-containing pattern MG1 contacts the third device isolation pattern 3m and separates between the first high-k dielectric pattern HK1 and the first separation pattern SP1. The second high-k dielectric pattern HK2 has a same structure.

The first and second separation patterns SP1 and SP2 may have their bottom surface lower than the top surface of the third device isolation pattern 3m. The bottom surfaces of the first and second separation patterns SP1 and SP2 may be located at the same height as, e.g., or lower than, that of the top surface of the third device isolation pattern 3m.

The first gate pattern GP1 may have a fourth width W4 parallel to the second direction Y. The first separation pattern SP1 may have a fifth width W5 parallel to the second direction Y. The fourth width W4 may be substantially the same as the fifth width W5. A width parallel to the second direction Y of each of the second, third, and fourth gate patterns GP2, GP3, and GP4 may be the same as the fourth width W4. A width parallel to the second direction Y of the second separation pattern SP2 may be the same as the fifth width W5.

Spacers 10 may cover sidewalls of the first, second, third, and fourth gate patterns GP1, GP2, GP3, and GP4 and sidewalls of the first and second separation patterns SP1 and SP2. The spacer 10 may have a single- or multi-layered structure that includes, e.g., one or more of a silicon oxide layer, a silicon nitride layer, and a silicon oxynitride layer.

In the cross-section taken along line C-C' in FIG. 2, the first active fins AF1 may be recessed at their upper portions on opposite sides of each of the first and third gate patterns GP1 and GP3, and the recessed upper portions may be replaced with first source/drain patterns SD1. As shown in FIG. 3, the second active fins AF2 may be recessed at their upper portions on opposite sides of each of the second and fourth gate patterns GP2 and GP4, and the recessed upper portions may be replaced with second source/drain patterns SD2. Each of the first and second source/drain patterns SD1 and SD2 may include an epitaxial layer of semiconductor, e.g., silicon and germanium. Each of the first and second source/drain patterns SD1 and SD2 may include doped N-type or P-type impurities. The first source/drain pattern SD1 may be spaced apart in the first direction X from the second source/drain pattern SD2. The first and second source/drain patterns SD1 and SD2 may have their top ends higher than the top surfaces of the first and second active fins AF1 and AF2.

A first interlayer dielectric layer 20 may fill a space between the first and second separation patterns SP1 and SP2, a portion of a space between the first and third gate patterns GP1 and GP3, and a portion of a space between the second and fourth gate patterns GP2 and GP4. The first interlayer dielectric layer 20 may have a top surface coplanar with those of the first and second separation patterns SP1 and SP2 and those of the first, second, third, and fourth gate patterns GP1, GP2, GP3, and GP4.

A second interlayer dielectric layer 30 may be disposed on the first interlayer dielectric layer 20. Each of the first and second interlayer dielectric layers 20 and 30 may have a single- or multi-layered structure that includes, e.g., one or more of a silicon oxide layer, a silicon nitride layer, a silicon oxynitride layer, and a porous low-k dielectric layer. Each of contact plugs 40 may penetrate the second and first interlayer dielectric layers 30 and 20 and have coupling to a corresponding one of the first and second source/drain patterns SD1 and SD2.

FIGS. 4 to 7, 8B, and 9 to 12 illustrate cross-sectional views showing stages in a method of manufacturing a semiconductor device having the cross-section of FIG. 2, according to some example embodiments. FIG. 8A illustrates a plan view of a method of manufacturing a semiconductor device having the plan view of FIG. 1, according to some example embodiments.

Figure 4:
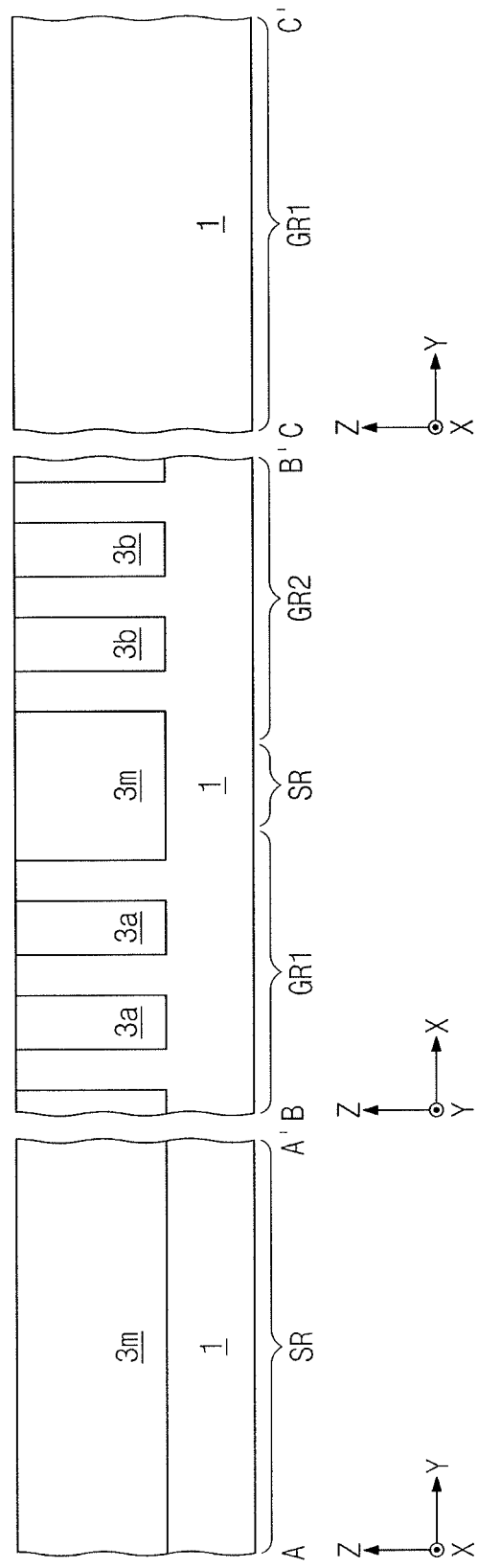
FIGS. 4 to 7, 8B, and 9 to 12 illustrate cross-sectional views of stages in a method of manufacturing a semiconductor device.

Referring to FIG. 4, the semiconductor substrate 1 may be prepared. The semiconductor substrate 1 may be a single crystalline silicon substrate or a silicon-on-insulator (SOI) substrate. The semiconductor substrate 1 may be etched to form a plurality of trenches. A device isolation layer may be formed on the semiconductor substrate 1 so as to fill the trenches, and then a planarization process may be performed to form the first, second, and third device isolation patterns 3a, 3b, and 3m and to expose a top surface of the semiconductor substrate 1. When viewed in plan view, the first, second, and third device isolation patterns 3a, 3b, and 3m may be formed in positions other than those overlapped by the first active fins AF1 and the second active fins AF2, as will be discussed below. The semiconductor substrate 1 may include the first gate region GR1 and the second gate region GR2 that are spaced apart from each other, and also include the separation region SR between the first and second gate region GR1 and GR2 (see FIG. 1).

Figure 5:
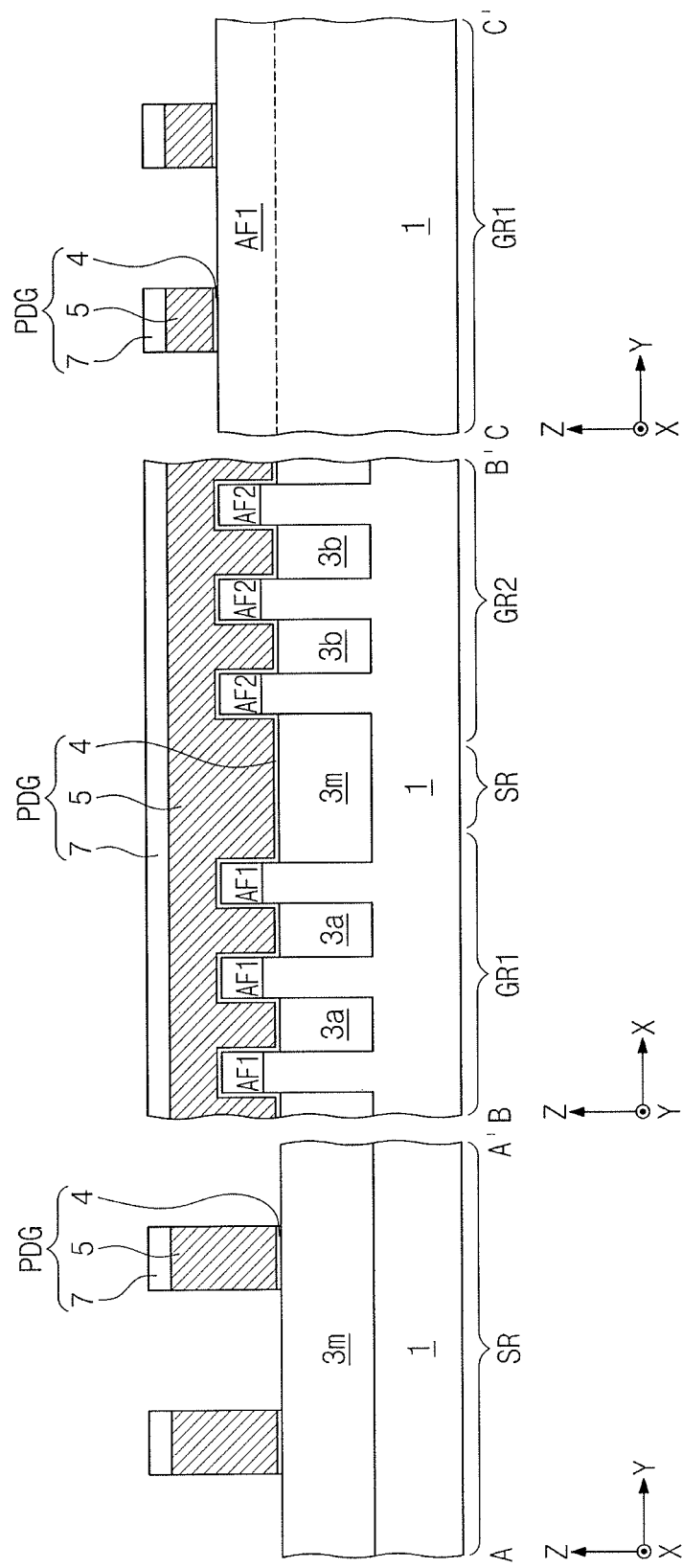

Referring to FIG. 5, an etch-back process may be performed to remove upper portions of the first, second, and third device isolation patterns 3a, 3b, and 3m and to expose portions of the semiconductor substrate 1 that are between the first, second, and third device isolation patterns 3a, 3b, and 3m. As such, the first and second active fins AF1 and AF2 may be formed. When viewed in plan view, as shown in FIG. 1, the first and second active fins AF1 and AF2 may be arranged in a plurality of linear shapes extending in the second direction Y. A dielectric layer, a polysilicon layer, and a dummy capping layer may be sequentially formed on an entire surface of the semiconductor substrate 1, and then patterned to form dummy gate patterns PDG. Each of the dummy gate patterns PDG may include a dummy gate dielectric pattern 4, a dummy polysilicon pattern 5, and a dummy capping pattern 7 that are sequentially stacked. The dummy gate dielectric pattern 4 may be formed of, e.g., a silicon oxide layer. The dummy capping pattern 7 may be formed of, e.g., a silicon nitride layer. When viewed in plan view, the dummy gate patterns PDG may have a plurality of linear shapes that are spaced apart from each other and extend in the first direction X. For example, when viewed in plan view, as shown in FIG. 1, one of the dummy gate patterns PDG may have a linear shape that runs along the first and third gate patterns GP1 and GP3 and the first separation pattern SP1 that are discussed above with reference to FIG. 1, and another one of the dummy gate patterns PDG may have a linear shape that runs along the second and fourth gate patterns GP2 and GP4 and the second separation pattern SP2 that are discussed above with reference to FIG. 1.

Figure 6:
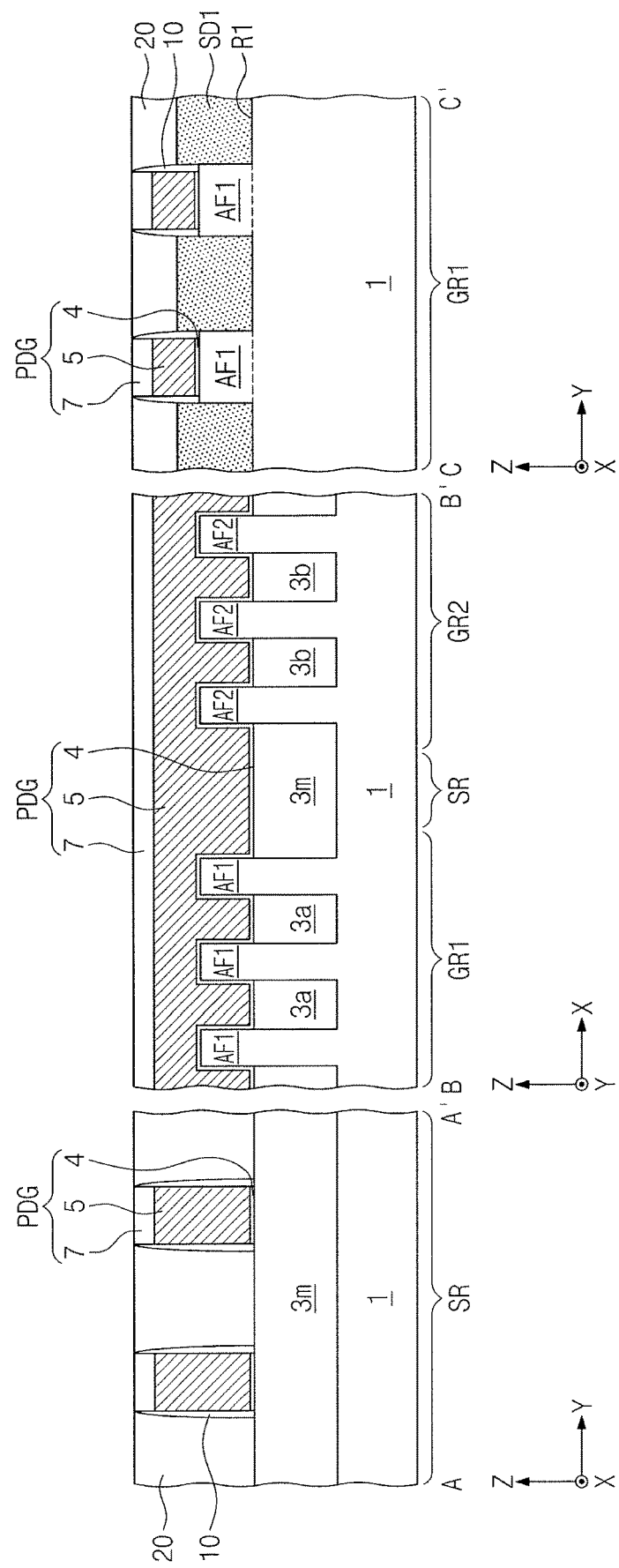

Referring to FIG. 6, a spacer layer may be conformally stacked on the entire surface of the semiconductor substrate 1 and then anisotropically etched to form the spacers 10 covering sidewalls of the dummy gate patterns PDG. The spacer 10 may be formed to have a single- or multi-layered structure that includes, e.g., one or more of a silicon oxide layer, a silicon nitride layer, and a silicon oxynitride layer. An etching process may be performed on the first and second active fins AF1 and AF2 on opposite sides of each of the dummy gate patterns PDG, which may result in the formation of recesses R1. One or more of silicon and germanium may be supplied to perform a selective epitaxial growth process to form the first source/drain patterns SD1 in the recesses R1. The second source/drain patterns SD2 may also be formed as shown in FIG. 3. The first interlayer dielectric layer 20 may be stacked on the entire surface of the semiconductor substrate 1 and then a planarization process may be performed to expose top surfaces of the dummy gate patterns PDG.

Figure 7:
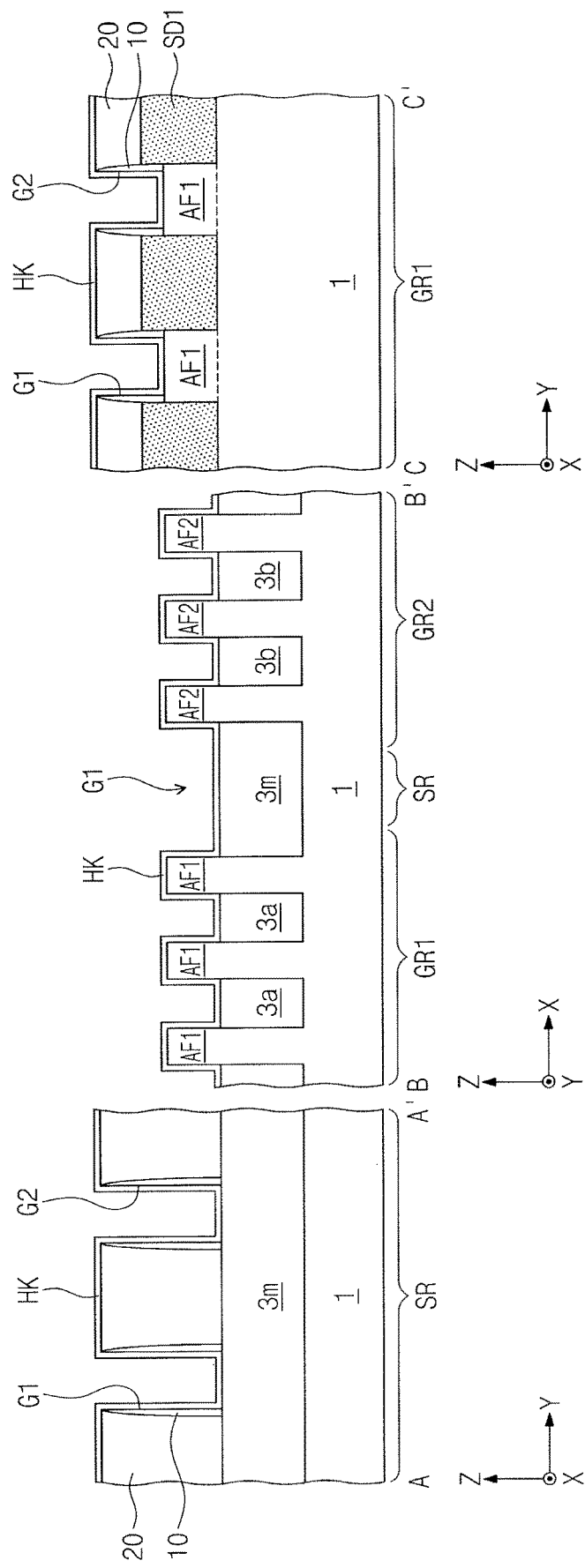
Figure 8A:
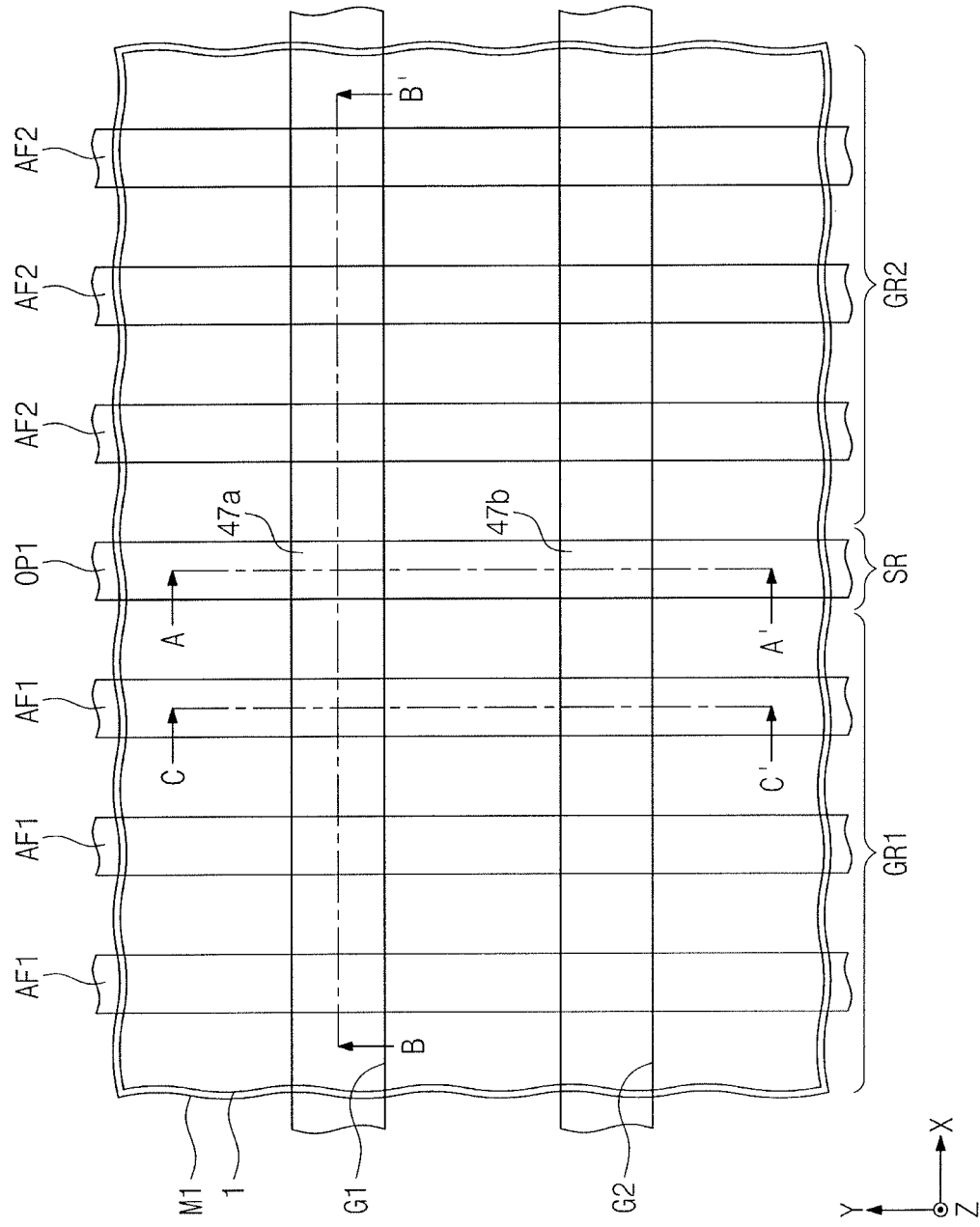
FIG. 8A illustrates a plan view of a stage in a method of manufacturing a semiconductor device having the plan view of FIG. 1.

Referring to FIG. 7, the exposed dummy gate patterns PDG may be removed to form a first groove G1 and a second groove G2 each of which extends in the first direction X between the spacers 10. The first and second grooves G1 and G2 may partially expose top surfaces and sidewalls of the first and second active fins AF1 and AF2, and also partially expose top surfaces of the first, second, and third device isolation patterns 3a, 3b, and 3m. A deposition process, e.g., chemical vapor deposition or atomic layer deposition, may be performed to conformally form a high-k dielectric layer HK on the entire surface of the semiconductor substrate 1. The high-k dielectric layer HK may also be conformally formed on an upper portion of the first interlayer dielectric layer 20 and on inner walls and floors of the first and second grooves G1 and G2. The high-k dielectric layer HK may be formed of a material, whose dielectric constant is greater than that of a silicon oxide layer, including one or more of, e.g., hafnium oxide ($HfO_2$), hafnium silicate (HfSiO), hafnium oxynitride (HfON), hafnium silicon oxynitride (HfSiON), hafnium aluminum oxide ($HfAlO_3$), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), titanium oxide ($TiO_2$), barium strontium titanium oxide (BaSrTiO), barium titanium oxide (BaTiO), strontium titanium oxide (SrTiO), yttrium oxide (YO), aluminum oxide ($Al_2O_3$), tantalum oxide ($Ta_2O_3$), and lead scandium tantalum oxide (PbScTaO). Before the high-k dielectric layer HK is formed, a silicon oxide layer or a silicon nitride layer may be formed as a gate dielectric layer.

Figure 8B:
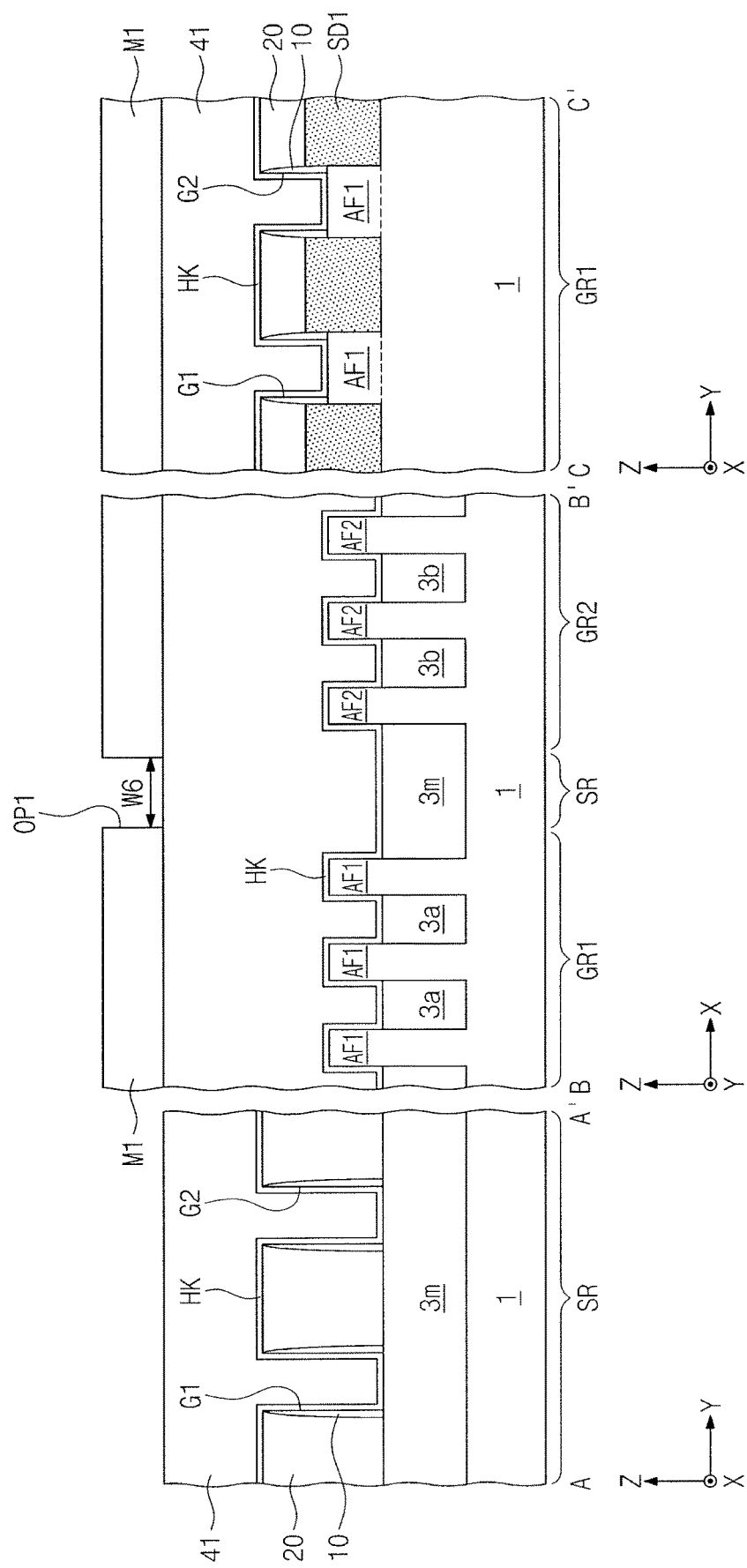

Referring to FIGS. 8A and 8B, a protective layer 41 may be stacked on the entire surface of the semiconductor substrate 1. The protective layer 41 may lie on the high-k dielectric layer HK and fill the first and second grooves G1 and G2. The protective layer 41 may have selectivity with respect to the high-k dielectric layer HK, and may be formed of a layer having superior gap-fill characteristics. For example, the protective layer 41 may be formed to have a single- or multi-layered structure that includes, e.g., one or more of a silicon nitride layer, a spin-on-carbon (SOC) layer, a spin-on-hardmask (SOH) layer, an amorphous carbon layer (ACL), and a bottom antireflective coating (BARC) layer that is a cross-linked organic polymer material. A first mask pattern M1 may be formed on the protective layer 41. For example, the first mask pattern M1 may be formed of a photoresist pattern. The first mask pattern M1 may be formed to have a first opening OP1 that partially exposes a top surface of the protective layer 41. When viewed in plan view, the first opening OP1 may be formed to have a linear or bar shape that is elongated in the second direction Y on the separation region SR. The first opening OP1 may have a sixth width W6 parallel to the first direction X.

Figure 9:
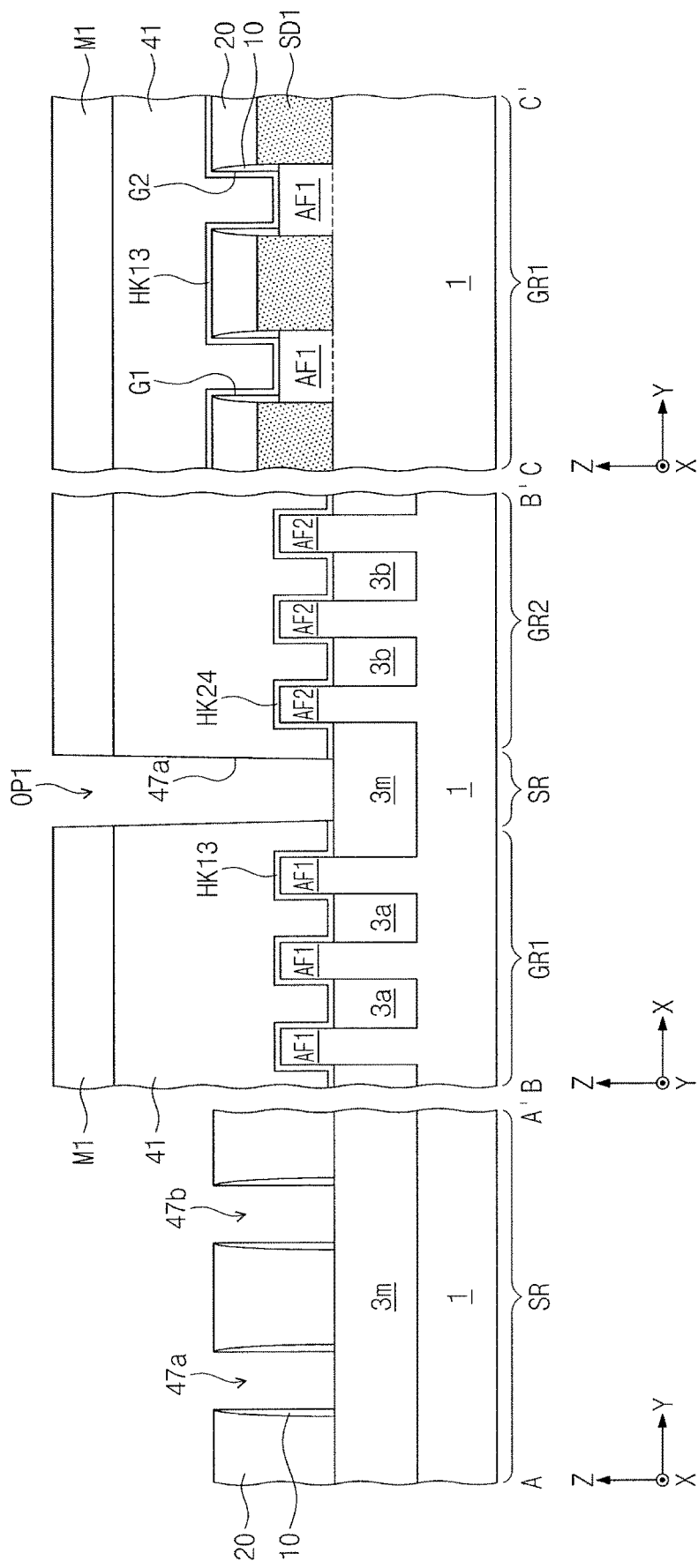

Referring to FIGS. 8A, 8B, and 9, an etching process may be performed in which the first mask pattern M1 is used as an etching mask to successively etch the protective layer 41 and the high-k dielectric layer HK, which etching process may form a first separation hole 47a and a second separation hole 47b that partially expose the top surface of the third device isolation pattern 3m. When viewed in plan view, the first separation hole 47a may be formed at a location where the first groove G1 and the first opening OP1 intersect each other, and the second separation hole 47b may be formed at a location where the second groove G2 and the first opening OP1 intersect each other. The etching process may remove the high-k dielectric layer HK from the separation region SR, and a residual high-k dielectric layer HK may be divided into a first preliminary high-k dielectric pattern HK13 and a second preliminary high-k dielectric pattern HK24 that are spaced apart from each other. The first preliminary high-k dielectric pattern HK13 may be disposed on the first gate region GR1, and the second preliminary high-k dielectric pattern HK24 may be disposed on the second gate region RG2. In a cross-sectional view taken along line C-C' in FIG. 9, the first preliminary high-k dielectric pattern HK13 may also be disposed on the first interlayer dielectric layer 20.

Figure 10:
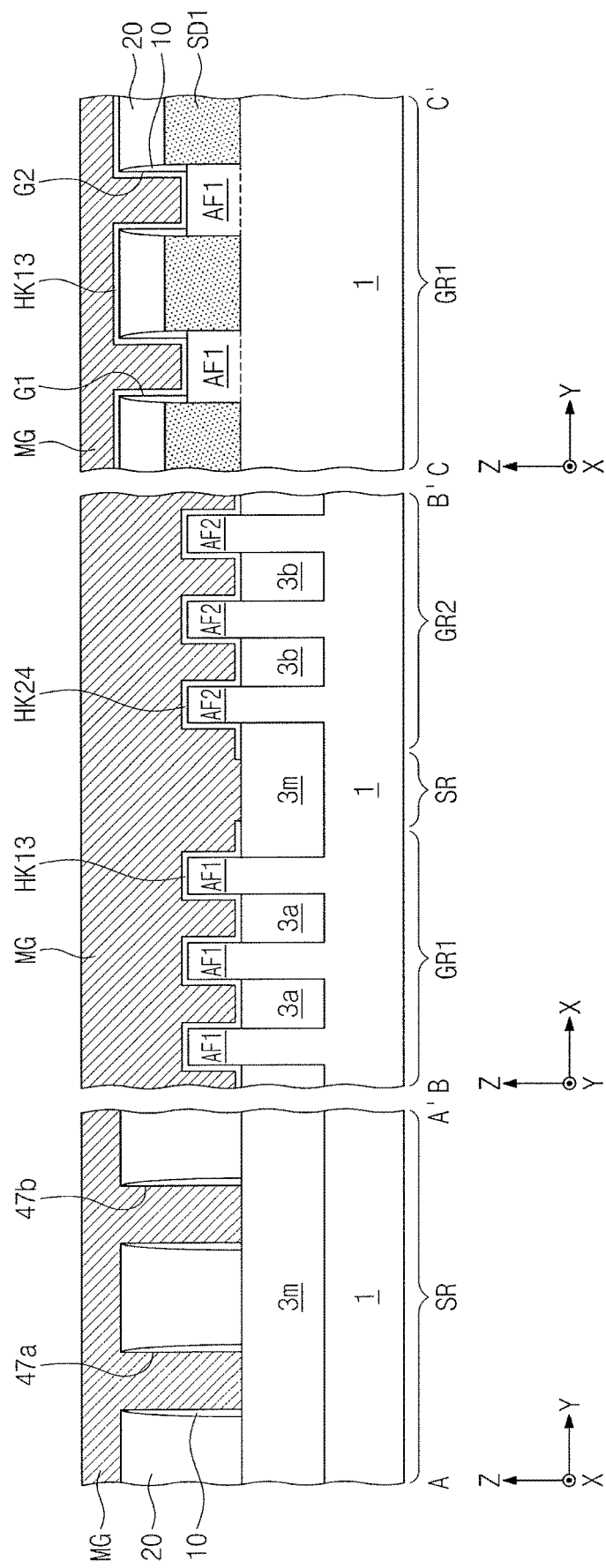

Referring to FIGS. 9 and 10, the first mask pattern M1 and the protective layer 41 may be removed. A plating process or a deposition process, e.g., sputtering or physical vapor deposition, may be used to stack a metal-containing layer MG on the entire surface of the semiconductor substrate 1. The metal-containing layer MG may be formed to include one or more of a work function layer, a diffusion break layer, and a metal line layer. The metal-containing layer MG may cover the first interlayer dielectric layer 20. The metal-containing layer MG may fill the first and second grooves G1 and G2 and the first and second separation holes 47a and 47b.

Figure 11:
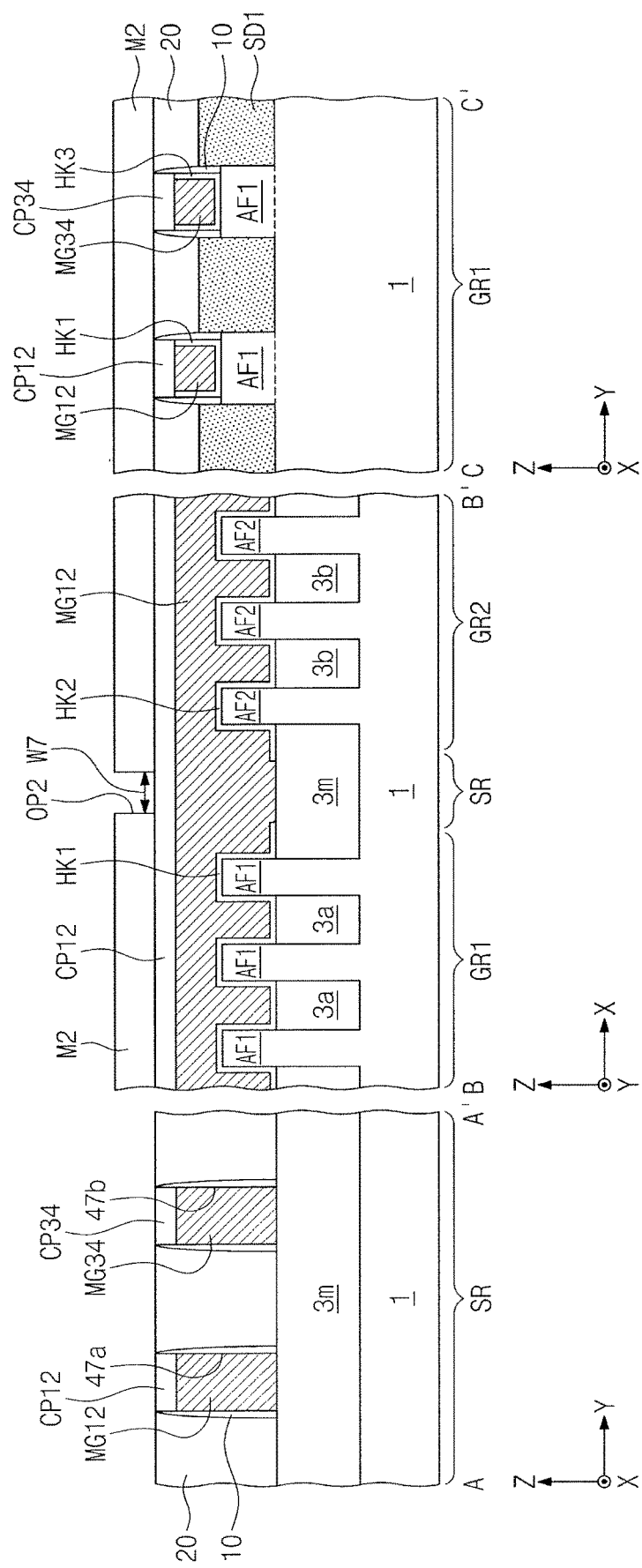

Referring to FIGS. 10 and 11, an etch-back process may be performed to remove the metal-containing layer MG, the first preliminary high-k dielectric pattern HK13, and the second preliminary high-k dielectric pattern HK24 that are on the first interlayer dielectric layer 20, to expose upper inner walls of the first and second grooves G1 and G2 and upper inner walls of the first and second separation holes 47a and 47b, to form a first preliminary metal-containing pattern MG12 in each of the first groove G1 and the first separation hole 47a, and to form a second preliminary metal-containing pattern MG34 in each of the second groove G2 and the second separation hole 47b. The first and second preliminary metal-containing patterns MG12 and MG34 may be formed to have their top surfaces lower than that of the first interlayer dielectric layer 20. A residual first preliminary high-k dielectric pattern HK13 may be divided into a first high-k dielectric pattern HK1 and a third high-k dielectric pattern HK3. Likewise, a residual second preliminary high-k dielectric pattern HK24 may be divided into a second high-k dielectric pattern HK2 and a fourth high-k dielectric pattern HK4. A capping layer may be stacked on the entire surface of the semiconductor substrate 1, and then an etch-back process may be performed to form a first preliminary capping pattern CP12 on the first preliminary metal-containing pattern MG12 and to form a second preliminary capping pattern CP34 on the second preliminary metal-containing pattern MG34.

Therefore, on the first gate region GR1, the first groove G1 may be provided therein with the first high-k dielectric pattern HK1, the first preliminary metal-containing pattern MG12, and the first preliminary capping pattern CP12, and the second groove G2 may be provided therein with the third high-k dielectric pattern HK3, the second preliminary metal-containing pattern MG34, and the second preliminary capping pattern CP34. On the second gate region GR2, the first groove G1 may be provided therein with the second high-k dielectric pattern HK2, the first preliminary metal-containing pattern MG12, and the first preliminary capping pattern CP12. On the second gate region GR2, the second groove G2 may be provided therein with the fourth high-k dielectric pattern HK4, the second preliminary metal-containing pattern MG34, and the second preliminary capping pattern CP34. No high-k dielectric pattern may be provided in each of the first and second separation holes 47a and 47b.

Referring to FIG. 11, a second mask pattern M2 may be formed on the first interlayer dielectric layer 20, the first preliminary capping pattern CP12, and the second preliminary capping pattern CP34. The second mask pattern M2 may be formed of, e.g., a photoresist pattern. The second mask pattern M2 may include a second opening OP2. The second opening OP2 may have identical or similar position and planar shape to those of the first opening OP1 of FIG. 8A. For example, when viewed in plan view, the second opening OP2 may have a linear or bar shape that is elongated in the second direction Y on the separation region SR. The second opening OP2 may have a seventh width W7 parallel to the first direction X. To stably separate gate patterns which will be discussed below in FIG. 12, the seventh width W7 may be less than the sixth width W6 of the first opening OP1. On the separation region SR, the second opening OP2 may expose the top surface of the first interlayer dielectric layer 20 and top surfaces of the first and second preliminary capping patterns CP12 and CP34.

Figure 12:
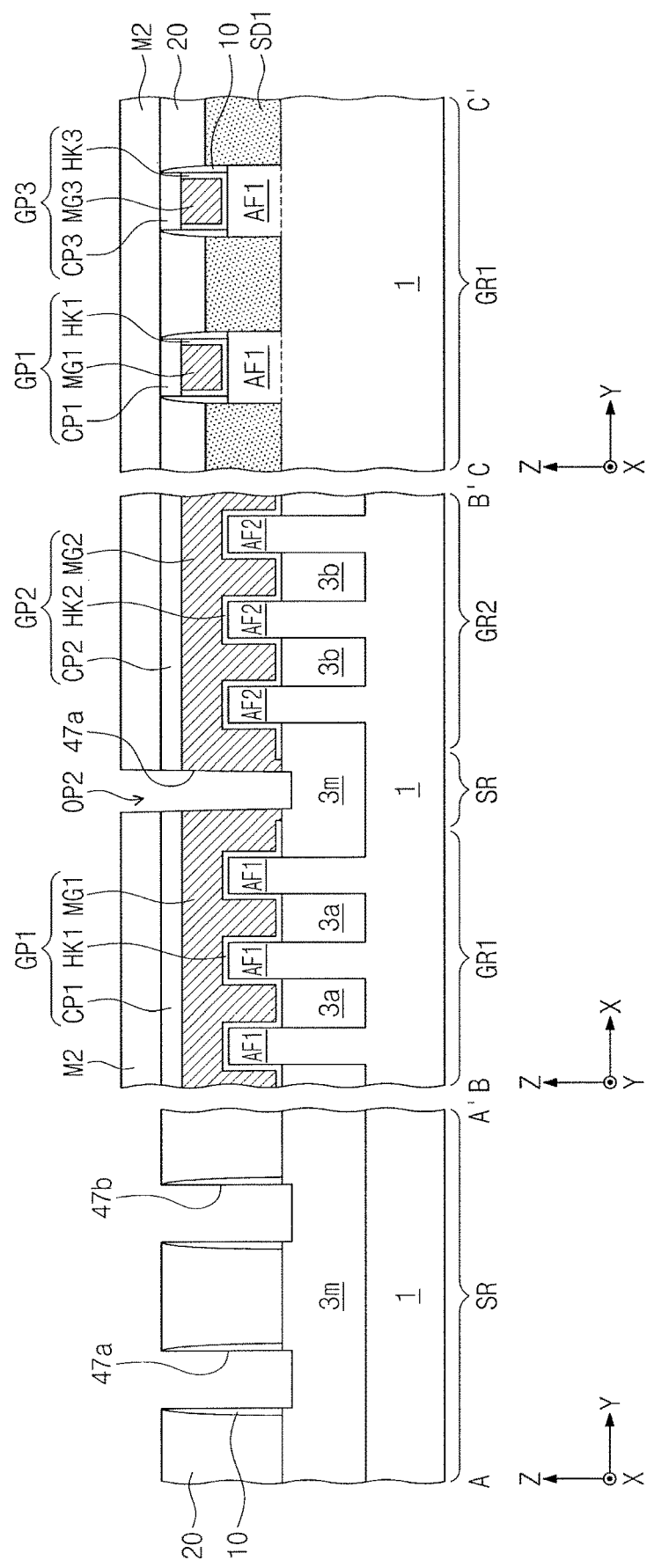

Referring to FIGS. 11 and 12, an etching process may be performed on the first and second preliminary capping patterns CP12 and CP34 that are exposed to the second opening OP2 on the separation region SR and on the first and second preliminary metal-containing patterns MG12 and MG34 below the exposed first and second preliminary capping patterns CP12 and CP34, which etching process may expose the top surface of the third device isolation pattern 3m and the inner walls of the first and second separation holes 47a and 47b. The first preliminary metal-containing pattern MG12 may thus be divided into a first metal-containing pattern MG1 and a second metal-containing pattern MG2. Likewise, the second preliminary metal-containing pattern MG34 may be divided into a third metal-containing pattern MG3 and a fourth metal-containing pattern MG4. In addition, the first preliminary capping pattern CP12 may be divided into a first capping pattern CP1 and a second capping pattern CP2. Likewise, the second preliminary capping pattern CP34 may be divided into a third capping pattern CP3 and a fourth capping pattern CP4. Therefore, the first gate pattern GP1 and the second gate pattern GP2 may be formed spaced apart from each other. The third gate pattern GP3 and the fourth gate pattern GP4 may also be formed spaced apart from each other. The etching process may be performed in an over-etching manner to reliably guarantee separation. Thus, an upper portion of the third device isolation pattern 3m may be partially recessed.

Because the first and second preliminary high-k dielectric patterns HK13 and HK24 are already cut in the step of FIG. 9, none of the first, second, third, and fourth high-k dielectric patterns HK1, HIK2, HK3, and HK4 are required to be etched during the etching process. Thus, there may be no difficulty in successively etching a metal-containing layer and a high-k dielectric layer, and it may be possible to avoid the possibility that the high-k dielectric layer remains on the separation region SR. In addition, the separation of gate patterns may be preferably accomplished to prevent bridge or short between the gate patterns. As a result, a semiconductor device may improve in reliability, decrease in defect rate, and increase in manufacturing yield.

Referring to FIGS. 12 and 2, the second mask pattern M2 may be removed. When the second mask pattern M2 is formed of a carbon-containing material, e.g., photoresist, an ashing process may be performed to remove the second mask pattern M2. The semiconductor substrate 1 may be stacked thereon with a separation layer to fill the first and second separation holes 47a and 47b, and then a polishing process may be performed to form the first separation pattern SP1 and the second separation pattern SP2 in the first separation hole 47a and the second separation hole 47b, respectively. Subsequently, referring to FIGS. 2 and 3, the second interlayer dielectric layer 30 may be stacked on the first interlayer dielectric layer 20. The second and first interlayer dielectric layers 30 and 20 may be patterned to form contact holes that expose the first and second source/drain patterns SD1 and SD2, and then the contact holes may be filled with a conductive material to form contact plugs 40.

Figure 13:
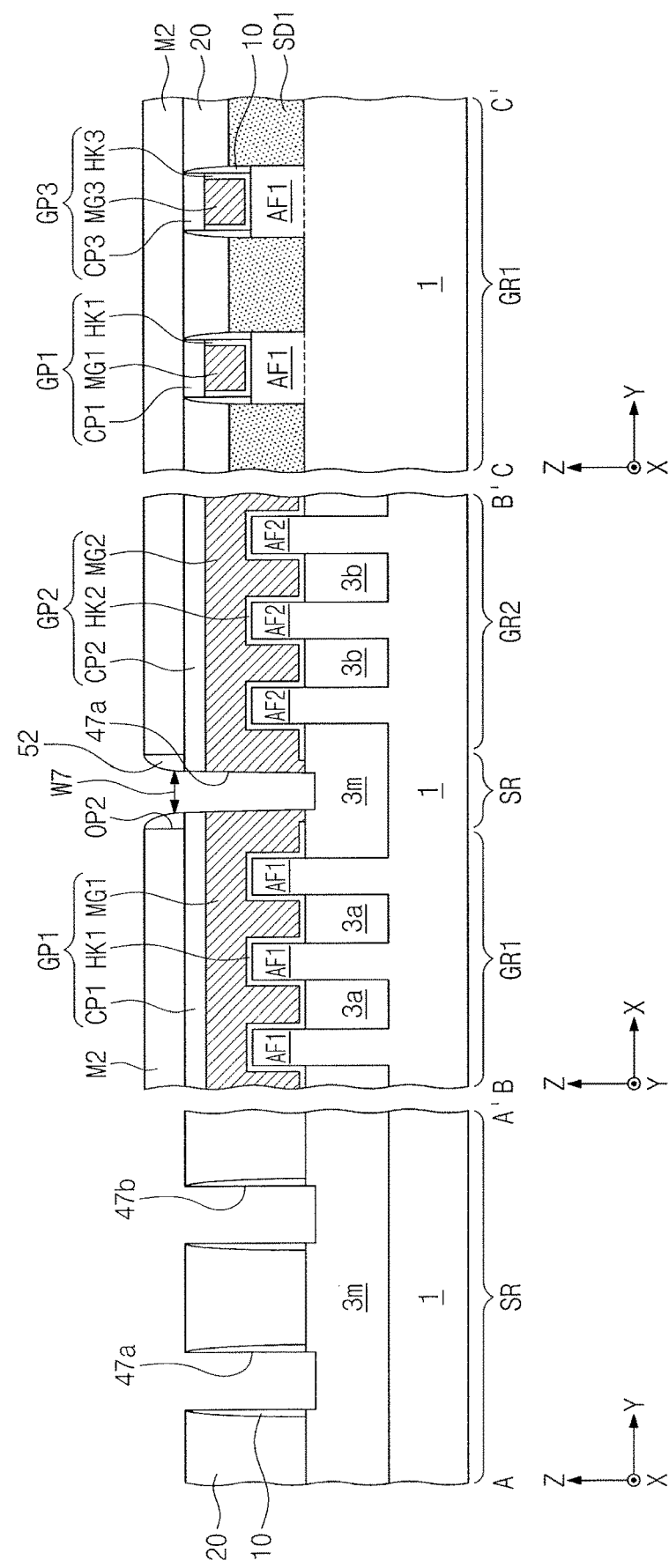
FIG. 13 illustrates a cross-sectional view showing a stage in a method of manufacturing a semiconductor device having the cross-sectional view of FIG. 2.

FIG. 13 illustrates a cross-sectional view showing a method of manufacturing a semiconductor device having the cross-sectional view of FIG. 2, according to some example embodiments.

Referring to FIG. 13, in the step of FIG. 11, the second opening OP2 may have a width greater than the seventh width W7. For example, the second opening OP2 may have a width equal to or greater than that of the first opening OP1 of FIG. 8B. In this case, a subsidiary spacer 52 may be additionally formed to cover a sidewall of the second opening OP2 such that the second opening OP2 may be controlled to finally have a width equal to the seventh width W7. The second mask pattern M2 and the subsidiary spacer 52 may be used as an etching mask to etch the exposed first and second preliminary capping patterns CP12 and CP34 and their underlying first and second preliminary metal-containing patterns MG12 and MG34, which etching may expose the top surface of the third device isolation pattern 3m and the inner walls of the first and second separation holes 47a and 47b. The first preliminary metal-containing pattern MG12 may thus be divided into the first metal-containing pattern MG1 and the second metal-containing pattern MG2. Likewise, the second preliminary metal-containing pattern MG34 may be divided into the third metal-containing pattern MG3 and the fourth metal-containing pattern MG4. In addition, the first preliminary capping pattern CP12 may be divided into the first capping pattern CP1 and the second capping pattern CP2. Likewise, the second preliminary capping pattern CP34 may be divided into the third capping pattern CP3 and the fourth capping pattern CP4. Therefore, the first gate pattern GP1 and the second gate pattern GP2 may be formed spaced apart from each other. The third gate pattern GP3 and the fourth gate pattern GP4 may also be formed spaced apart from each other. Subsequently, the second mask pattern M2 and the subsidiary spacer 52 may be removed, and the first and second separation patterns SP1 and SP2 may be formed.

As discussed above, on the separation region SR, a high-k dielectric layer may be first removed, and thereafter a metal-containing layer may be removed to separate gate patterns. When the metal-containing layer and the high-k dielectric layer are successively etched on the separation region SR, i.e., without cutting the high-k dielectric layer in advance, the high-k dielectric layer may be hardly etched with an etchant for etching the metal-containing layer. Furthermore, metal residues may remain on the high-k dielectric layer, and accordingly the high-k dielectric layer may be harder to etch. Therefore, the high-k dielectric layer may remain on the separation region SR, and in this case, the gate patterns may suffer from bridge or short, which in turn, may deteriorate reliability of a semiconductor device.

In contrast, according to example embodiments, because the high-k dielectric layer is first removed, the high-k dielectric layer may not be required to be etched in an etching process where the metal-containing layer is etched to separate the gate patterns. Hence, a gate separation process may be easily performed, and the high-k dielectric layer may not remain on the separation region SR, with the result that a semiconductor may improve in reliability and decrease in defect rate. Furthermore, a manufacturing yield may be increased.

Figure 14:
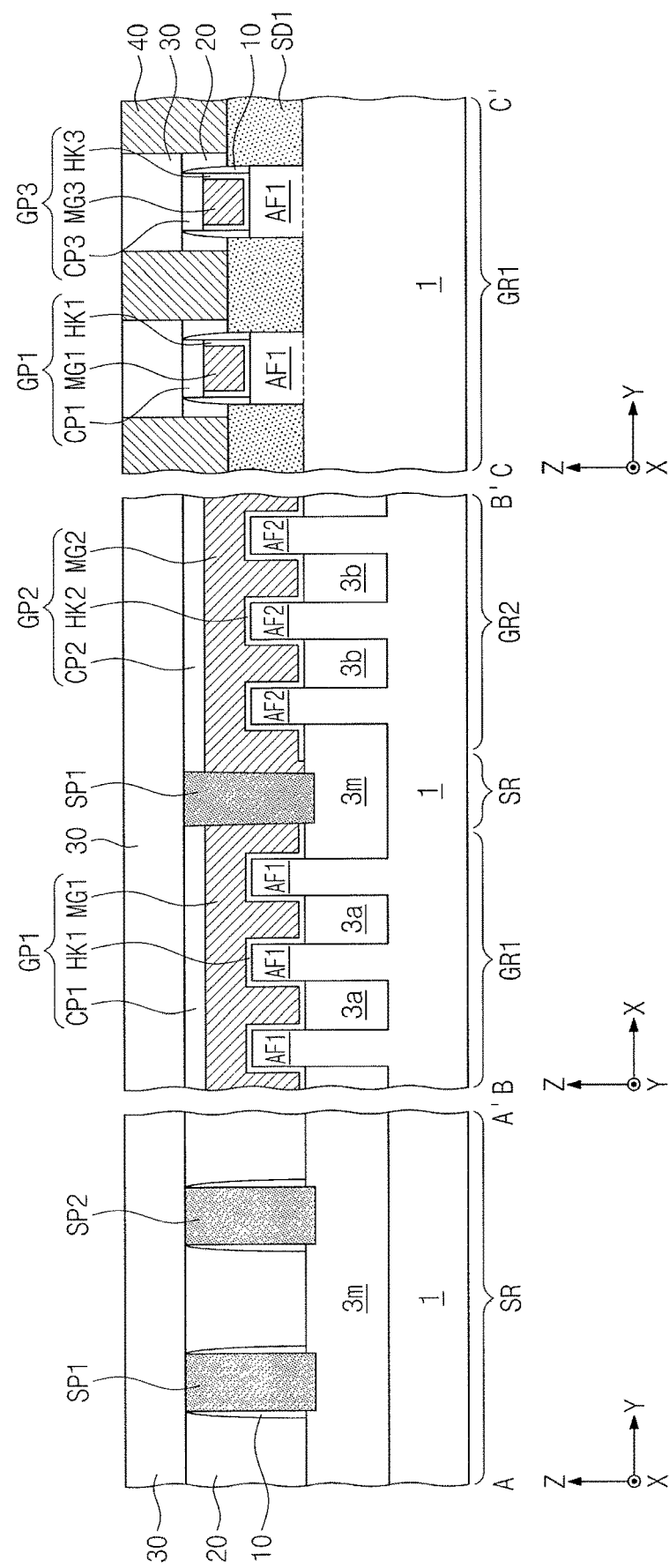
FIG. 14 illustrates a cross-sectional view along lines A-A', B-B', C-C' of FIG. 1, according to other example embodiments.

FIG. 14 illustrates a cross-sectional view taken along lines A-A', B-B', C-C' of FIG. 1, according to some example embodiments.

Referring to FIG. 14, the first separation pattern SP1 may be in contact with the sidewall of the first high-k dielectric pattern HK1, but spaced apart from the sidewall of the second high-k dielectric pattern HK2. Other configurations may be identical or similar to those discussed above with reference to FIG. 2. The structure shown in FIG. 14 may be eventually formed when a slight misalignment occurs, in the step of FIG. 12, to cause the sidewall of the first high-k dielectric pattern HK1 to be exposed at the inner wall of the first separation hole 47a.

Figure 15:
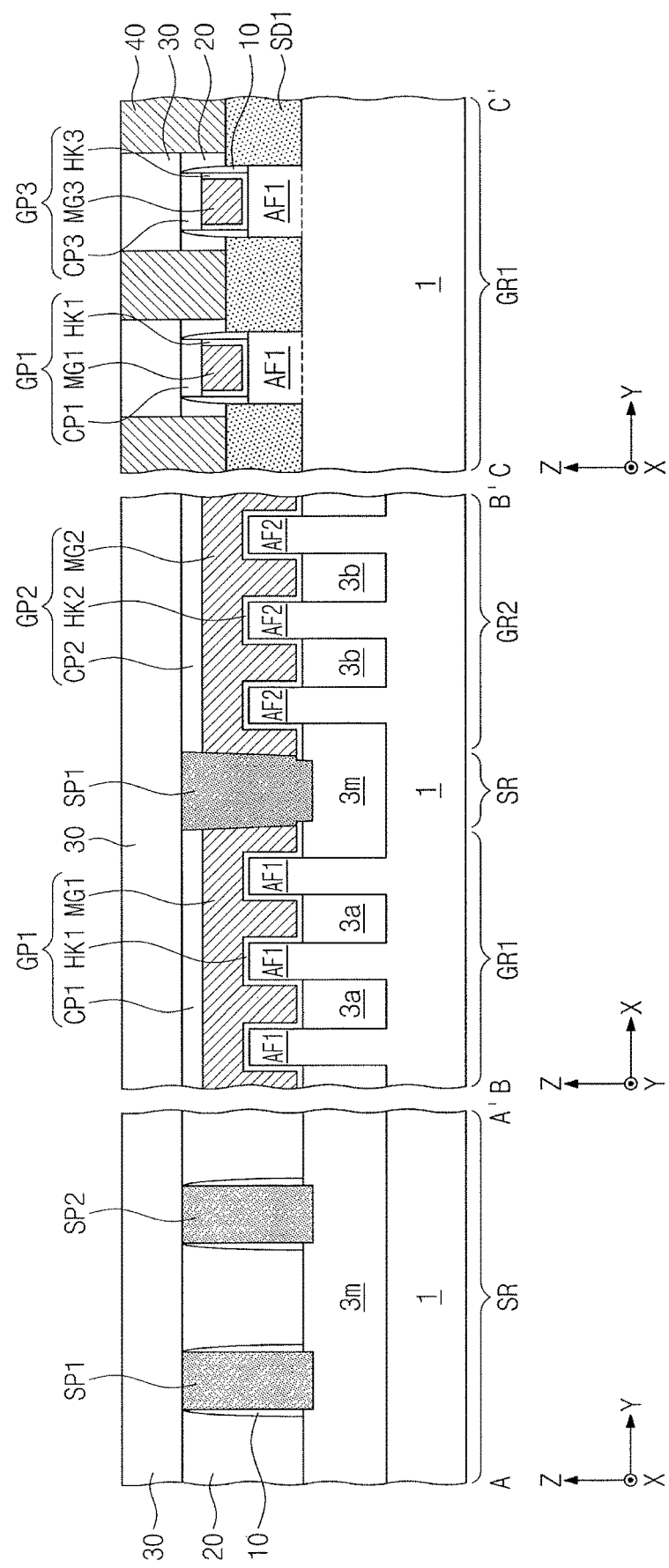
FIG. 15 illustrates a cross-sectional view along lines A-A', B-B', C-C' of FIG. 1, according to other example embodiments.

FIG. 15 illustrates a cross-sectional view taken along lines A-A', B-B', C-C' of FIG. 1, according to some example embodiments.

Referring to FIG. 15, the first separation pattern SP1 may be in contact with the sidewall of the first high-k dielectric pattern HK1 and also with the sidewall of the second high-k dielectric pattern HK2. The first separation pattern SP1 may have a bottom surface whose width is equal to or less than an interval between the first high-k dielectric pattern HK1 and the second high-k dielectric pattern HK2. Other configurations may be identical or similar to those discussed above with reference to FIG. 2. The structure shown in FIG. 15 may be formed when the second opening OP2 of the second mask pattern M2 shown in FIG. 11 has the seventh width W7 equal to or greater than the sixth width W6 of the first opening OP1 of the first mask pattern M1 shown in FIG. 8B.

Figure 16:
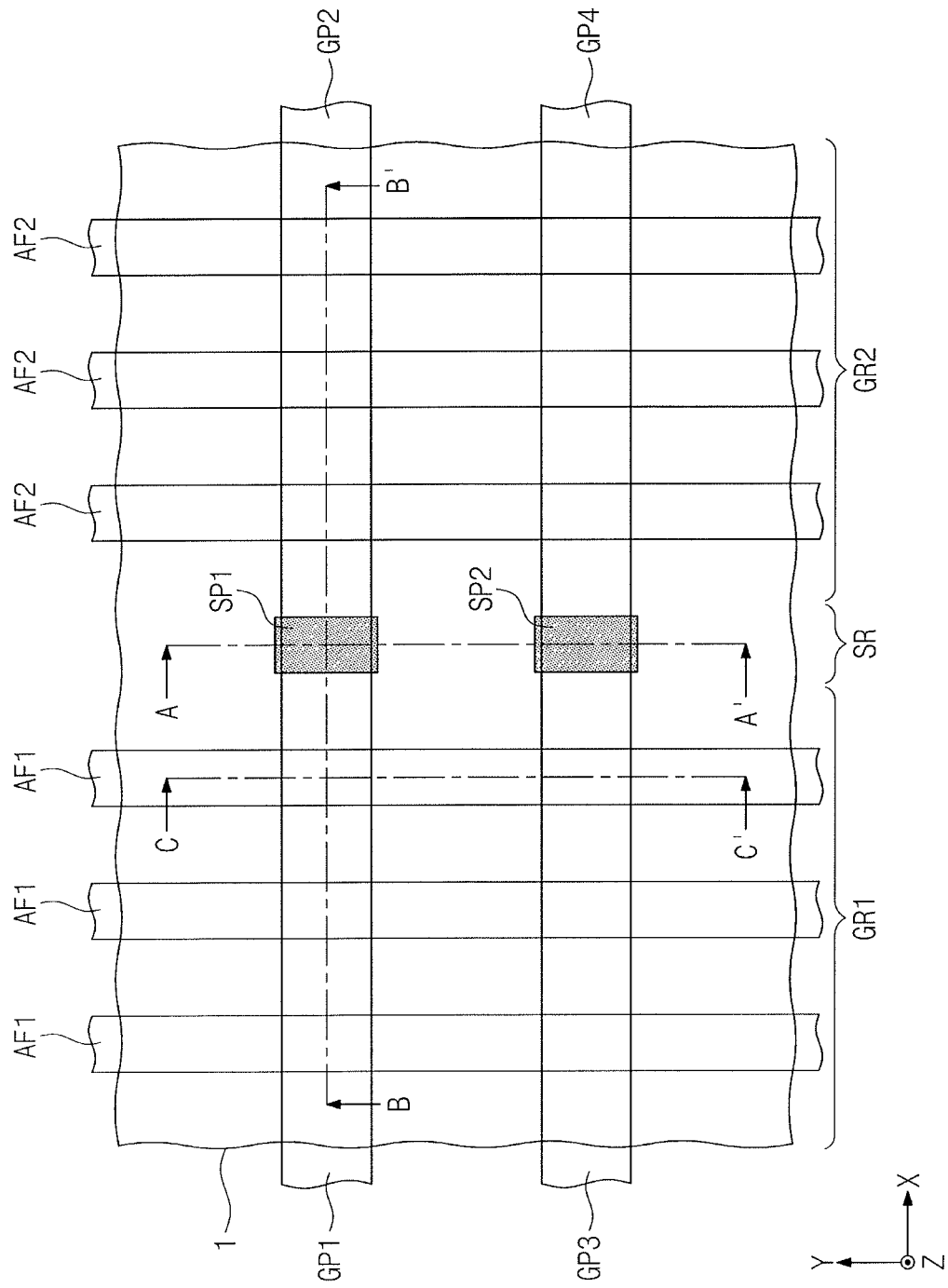
FIG. 16 illustrates a plan view of a semiconductor device according to some example embodiments.
Figure 17:
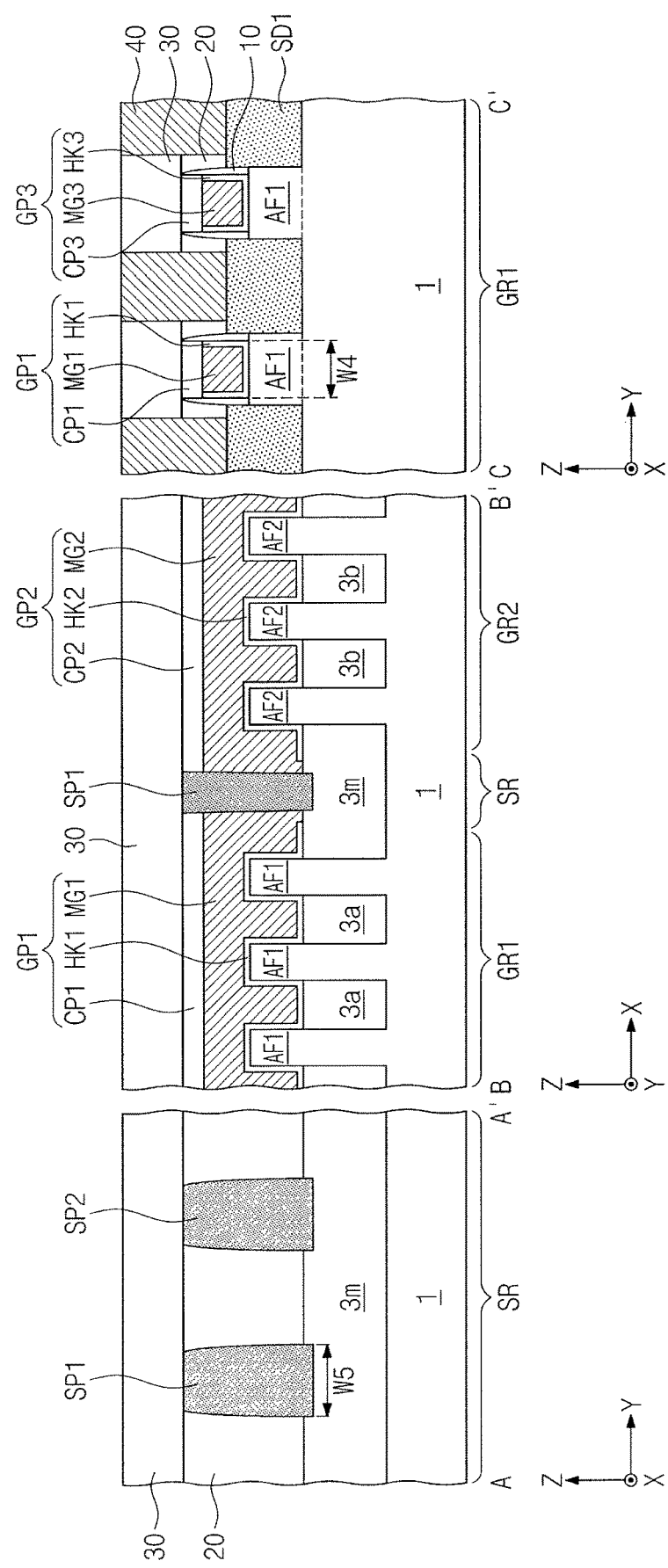
FIG. 17 illustrates a cross-sectional view along lines A-A', B-B', C-C' of FIG. 16, according to some example embodiments.

FIG. 16 illustrates a plan view showing a semiconductor device according to some example embodiments. FIG. 17 illustrates a cross-sectional view taken along lines A-A', B-B', C-C' of FIG. 16, according to some example embodiments.

Referring to FIGS. 16 and 17, the first separation pattern SP1 and the second separation pattern SP2 may not be in contact with the spacer 10 of FIG. 2, but in direct contact with the first interlayer dielectric layer 20. The fifth width W5 parallel to the second direction Y of the first separation pattern SP1 may be greater than the fourth width W4 parallel to the second direction Y of the first gate pattern GP1. Other configurations may be identical or similar to those discussed with reference to FIGS. 1 and 2. A semiconductor device according to the present embodiment may be manufactured as follows. In the step of FIG. 12, when an etching process is performed on the first and second preliminary capping patterns CP12 and CP34 exposed to the second opening OP2 and on the first and second preliminary metal-containing patterns MG12 and MG34 below the exposed first and second preliminary capping patterns CP12 and CP34, the spacers 10 may all be simultaneously removed from the separation region SR. Therefore, the first interlayer dielectric layer 20 may be exposed in the second direction Y at the inner walls of the first and second separation holes 47a and 47b. Subsequent processes may be identical or similar to those discussed above with reference to FIG. 2.

Figure 18:
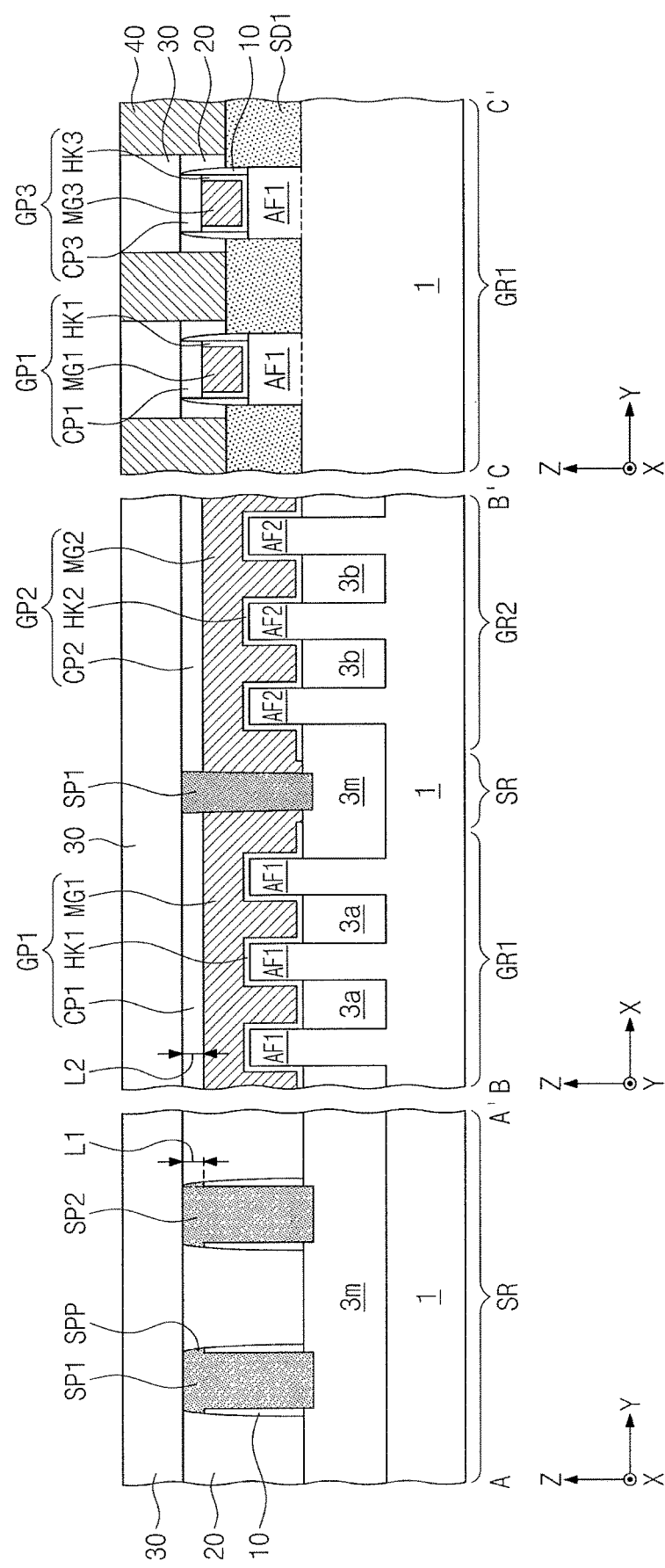
FIG. 18 illustrates a cross-sectional view along lines A-A', B-B', C-C' of FIG. 16, according to some example embodiments.

FIG. 18 illustrates a cross-sectional view taken along lines A-A', B-B', C-C' of FIG. 16, according to some example embodiments.

Referring to FIG. 18, each of the first and second separation patterns SP1 and SP2 may have, at an upper portion thereof, a separation pattern protrusion SPP that protrudes in the second direction Y from a sidewall thereof. The separation pattern protrusion SPP may have a first vertical length L1 between top and bottom ends thereof, and the first vertical length L1 may be substantially the same as a second vertical length L2 corresponding to a thickness of the first capping pattern CP1. The spacer 10 may remain below the separation pattern protrusion SPP. The separation pattern protrusion SPP may cause the spacer 10 to have a top end that is located at a lower height than that of top surfaces of the first and second separation patterns SP1 and SP2. Other configurations may be identical or similar to those discussed above with reference to FIG. 2.

The structure of FIG. 18 may be formed as follows. In the step of FIG. 12, when an etching process is performed on the first and second preliminary capping patterns CP12 and CP34 exposed to the second opening OP2, an upper portion of the spacer 10 may also be etched. An etching depth of the spacer 10 may be the same as thicknesses of the first and second preliminary capping patterns CP12 and CP34. The spacer 10 may remain on the separation region SR. Processes identical or similar to those discussed above with reference to FIG. 2 may be subsequently performed.

Figure 19:
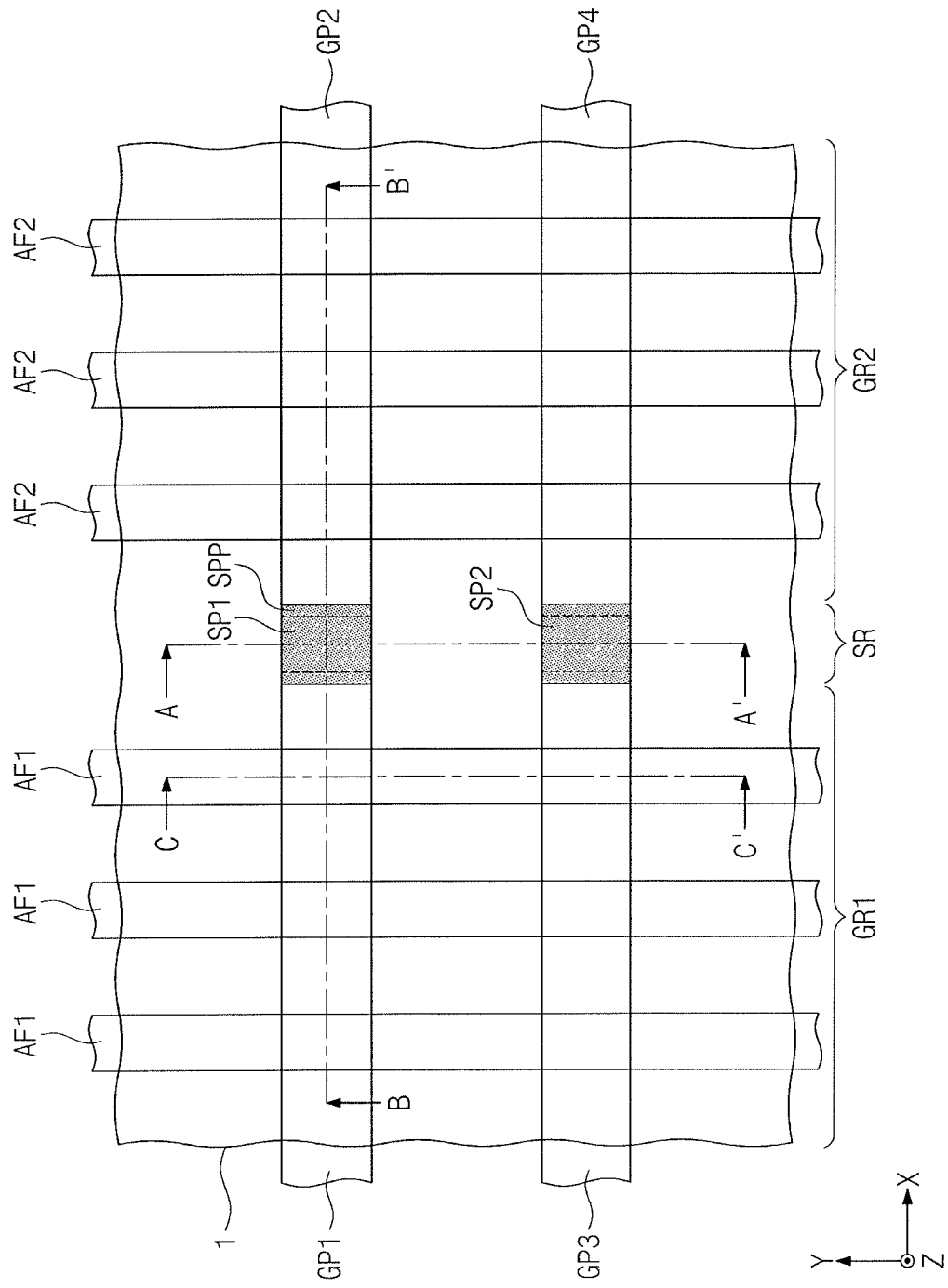
FIG. 19 illustrates a plan view of a semiconductor device according to some example embodiments.
Figure 20:
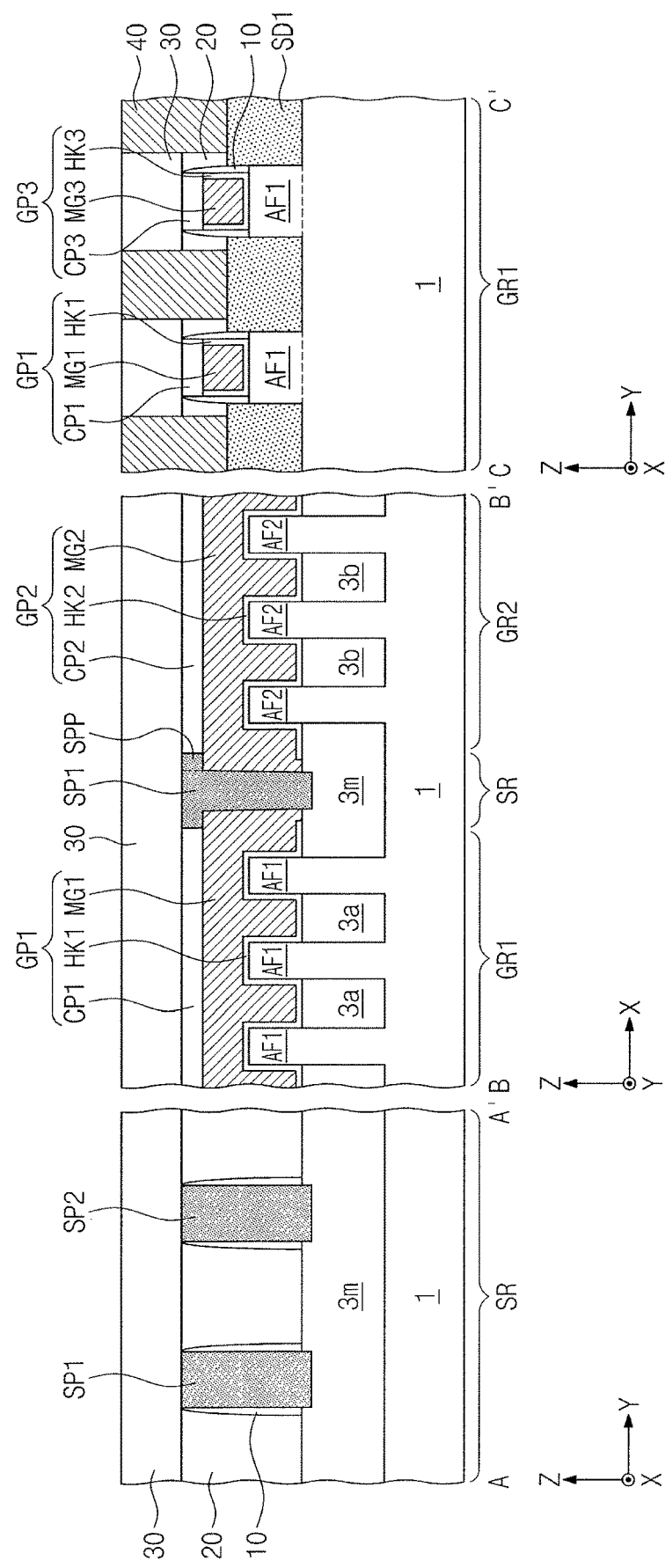
FIG. 20 illustrates a cross-sectional view along lines A-A', B-B', C-C' of FIG. 19, according to some example embodiments.

FIG. 19 illustrates a plan view showing a semiconductor device according to some example embodiments. FIG. 20 illustrates a cross-sectional view taken along lines A-A', B-B', C-C' of FIG. 19, according to some example embodiments.

Referring to FIGS. 19 and 20, the first separation pattern SP1 may have, at the upper portion thereof, the separation pattern protrusion SPP that protrudes in the first direction X from the sidewall thereof. The first separation pattern SP1 may have a T-shaped cross-section. Although not shown, the second separation pattern SP2 may have a cross-section identical or similar to that of the first separation pattern SP1. The separation pattern protrusion SPP may partially cover top surfaces of the first and second metal-containing patterns MG1 and MG2. Other configurations may be identical or similar to those discussed above with reference to FIG. 2.

Figure 21:
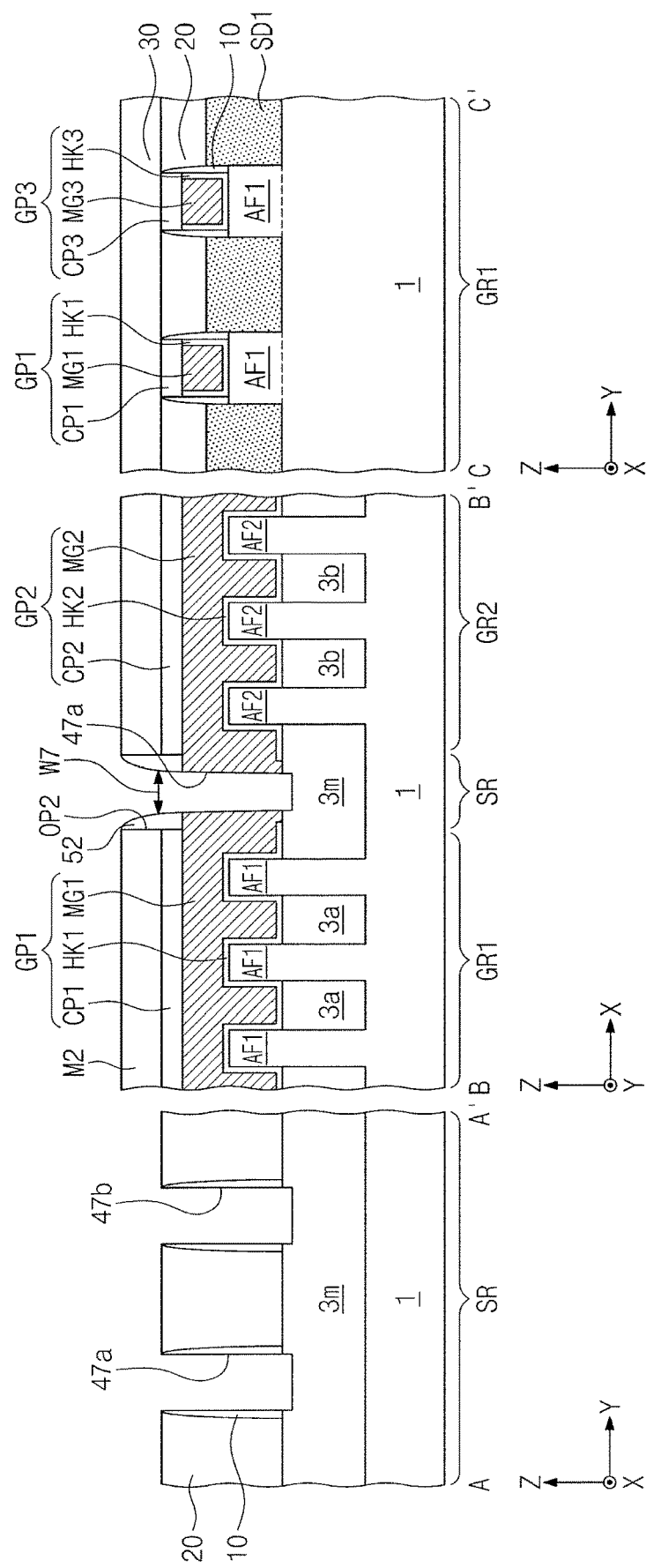
FIG. 21 illustrates a cross-sectional view of a stage in a method of manufacturing a semiconductor device having the cross-sectional view of FIG. 20.

FIG. 21 illustrates a cross-sectional view showing a method of manufacturing a semiconductor device having the cross-sectional view of FIG. 20, according to some example embodiments.

Referring to FIG. 21, in a state identical or similar to that illustrated in FIG. 11, the second mask pattern M2 may be used as an etching mask to etch the exposed first and second preliminary capping patterns CP12 and CP34, and thus the first preliminary metal-containing pattern MG12 may be exposed at its top surface. The second opening OP of the second mask pattern M2 may have a width greater than the seventh width W7 of FIG. 11. The first preliminary capping pattern CP12 may be divided into the first capping pattern CP1 and the second capping pattern CP2. A subsidiary spacer 52 may be formed to cover each sidewall of the second mask pattern M2, the first capping pattern CP1, and the second capping pattern CP2. The formation of the subsidiary spacer 52 may cause the width of the second opening OP2 to be reduced eventually to the seventh width W7. The subsidiary spacer 52 and the second mask pattern M2 may be used as an etching mask to etch the first and second preliminary metal-containing patterns MG12 and MG34, which etching may form the first and second separation holes 47a and 47b.

Subsequently, the second mask pattern M2 and the subsidiary spacer 52 may be removed, and the first and second separation patterns SP1 and SP2 may be formed.

Figure 22:
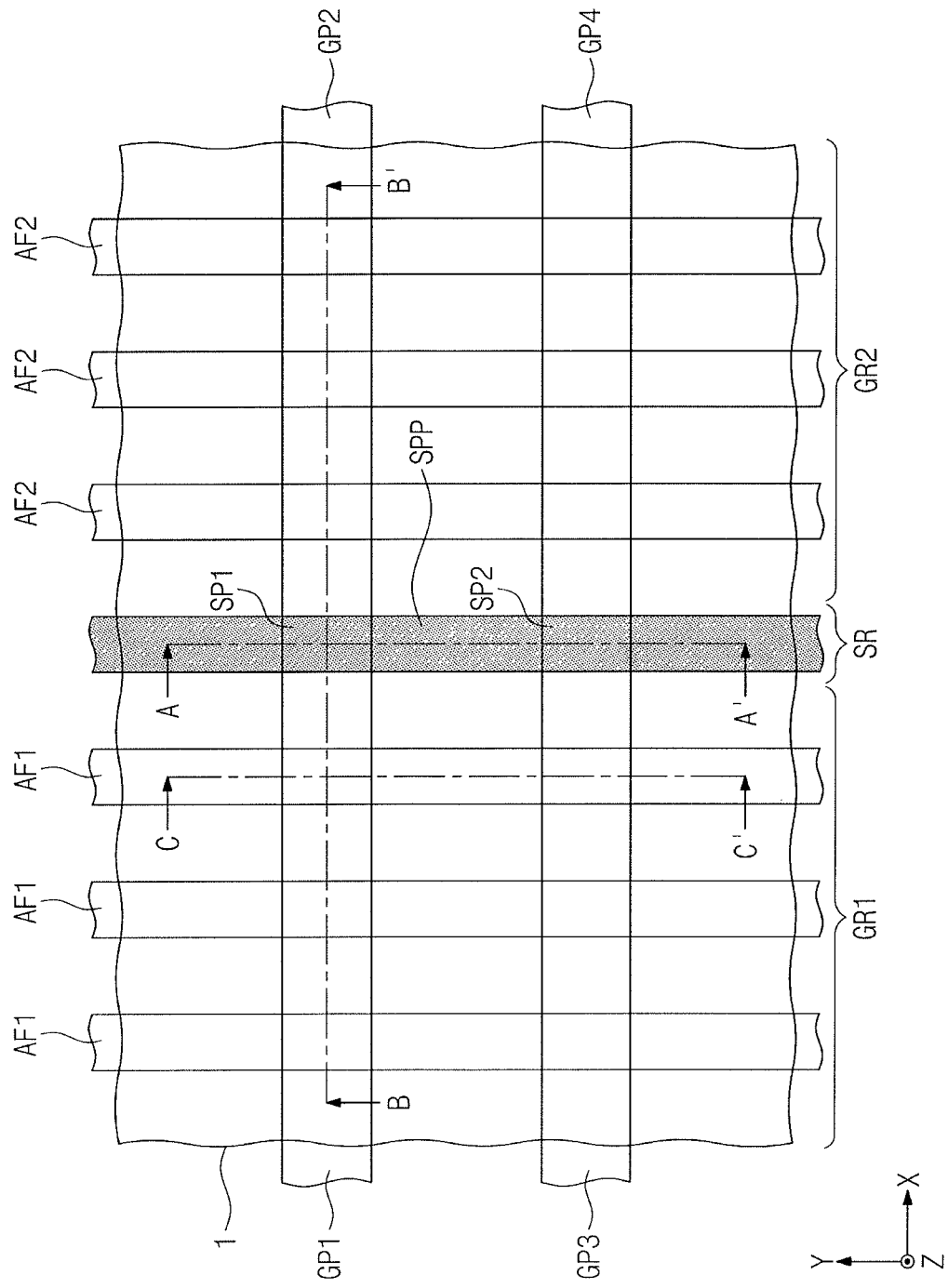
FIG. 22 illustrates a plan view of a semiconductor device according to some example embodiments.
Figure 23:
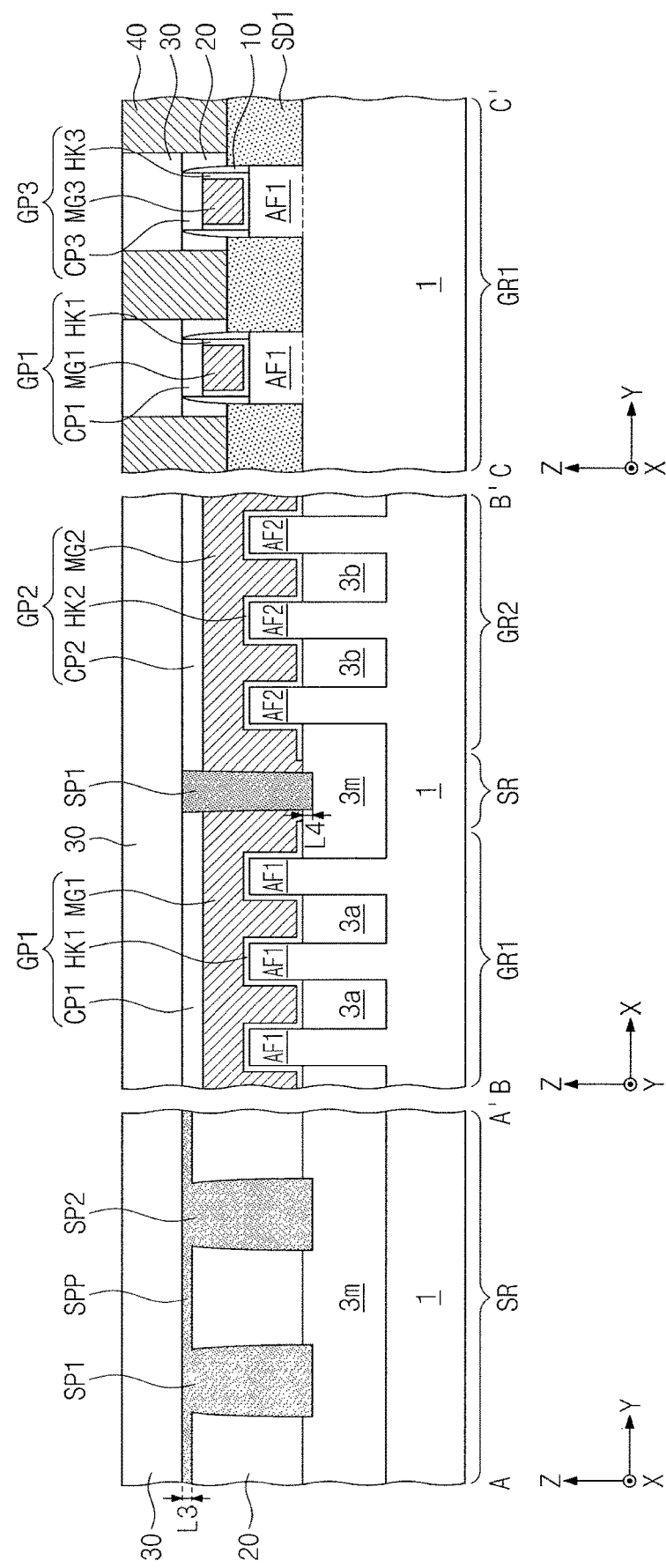
FIG. 23 illustrates a cross-sectional view along lines A-A', B-B', C-C' of FIG. 22.

FIG. 22 illustrates a plan view showing a semiconductor device according to some example embodiments. FIG. 23 illustrates a cross-sectional view taken along lines A-A', B-B', C-C' of FIG. 22, according to some example embodiments.

Referring to FIGS. 22 and 23, the top surface of the first interlayer dielectric layer 20 may be lower than those of the first and second separation patterns SP1 and SP2. A third vertical length L3 corresponding to a height from the top surface of the first interlayer dielectric layer 20 to the top surface of the first separation pattern SP1 may be substantially the same as a fourth vertical length L4 corresponding to a height from the top surface of the third device isolation pattern 3m to the bottom surface of the first separation pattern SP1. Each of the first and second separation patterns SP1 and SP2 may have, at the upper portion thereof, the separation pattern protrusion SPP that extends in the second direction Y from the sidewall thereof. The separation pattern protrusions SPP may be connected to each other such that, when viewed in plan as shown in FIG. 22, the first and second separation patterns SP1 and SP2 may be integrally formed into a linear or bar shape that is elongated in the second direction Y. Other configurations may be identical or similar to those discussed above with reference to FIG. 17.

The semiconductor device of FIG. 23 may be manufactured as follows. In the step of FIG. 12, when an etching process is performed on the first and second preliminary capping patterns CP12 and CP34 exposed to the second opening OP2 and on the first and second preliminary metal-containing patterns MG12 and MG34 below the exposed first and second preliminary capping patterns CP12 and CP34, the spacers 10 may all be simultaneously removed from the separation region SR. In addition, when an upper portion of the third device isolation pattern 3m is over-etched, an upper portion of the first interlayer dielectric layer 20 may also be etched on the separation region SR, and accordingly the top surface of the first interlayer dielectric layer 20 may be lowered. When the third device isolation pattern 3m and the first interlayer dielectric layer 20 are formed of the same material such as a silicon oxide layer, the first interlayer dielectric layer 20 may be removed as much as a thickness removed from the upper portion of the third device isolation pattern 3m. Other manufacturing processes may be identical or similar to those discussed with reference to FIG. 17.

Figure 24A:
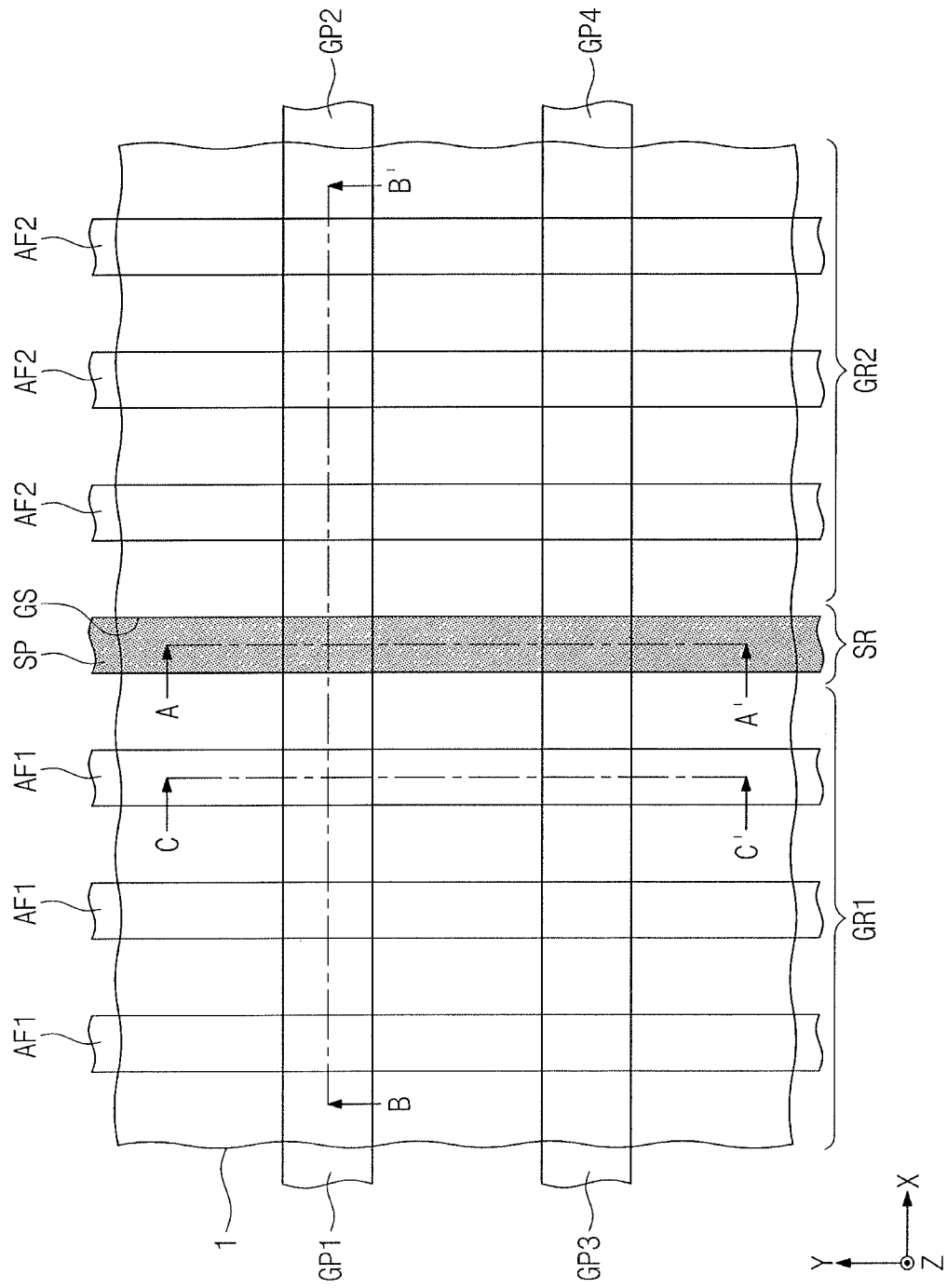
FIG. 24A illustrates a plan view of a semiconductor device according to some example embodiments.
Figure 24B:
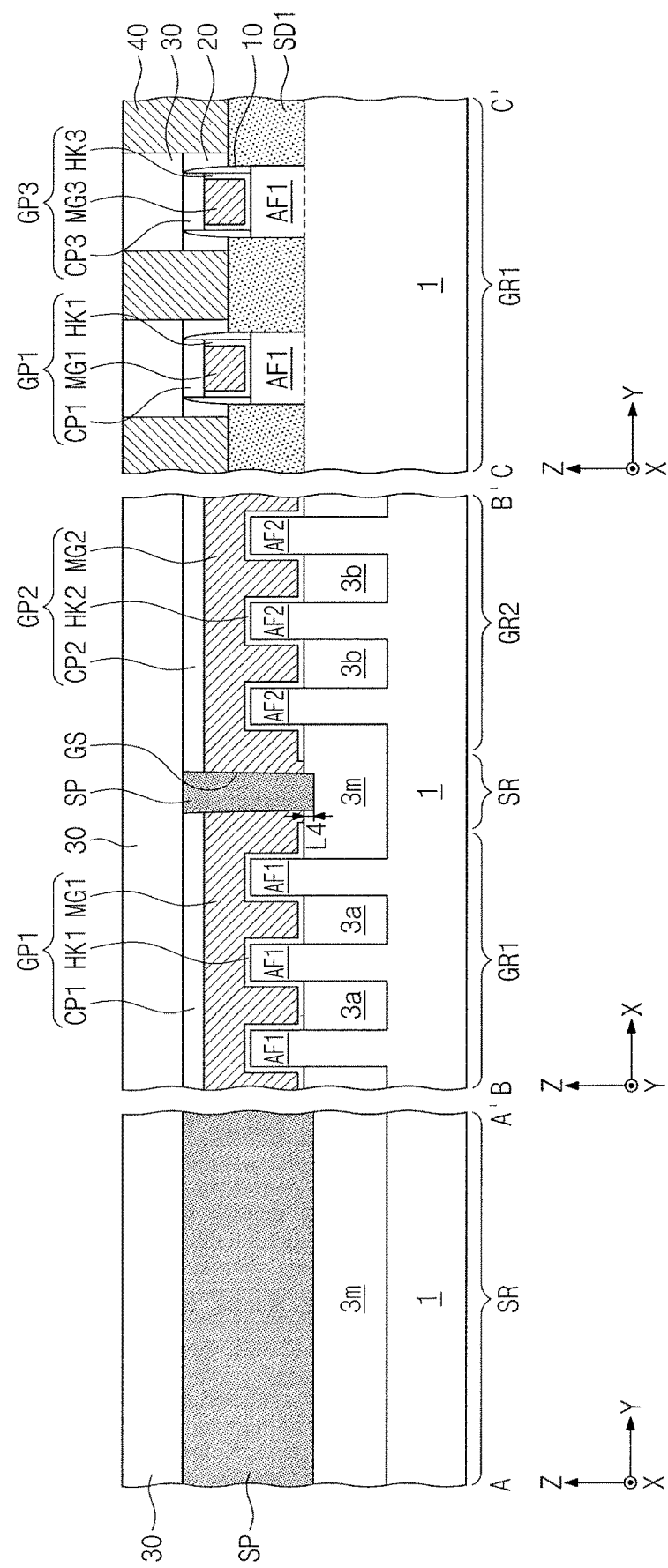
FIG. 24B illustrates a cross-sectional view along lines A-A', B-B', C-C' of FIG. 24A.

FIG. 24A illustrates a plan view showing a semiconductor device according to some example embodiments. FIG. 24B illustrates a cross-sectional view taken along lines A-A', B-B', C-C' of FIG. 24A, according to some example embodiments.

Referring to FIGS. 24A and 24B, the separation region SR may include a separation pattern SP, which has a linear shape extending along the second direction Y. The separation pattern SP may be interposed not only between the first and second gate patterns GP1 and GP2 but also between the third and fourth gate patterns GP3 and GP4. The separation pattern SP may be disposed in a separation groove GS. The separation pattern SP may be spaced apart from all of the first and second high-k dielectric patterns HK1 and HK2. The separation pattern SP may have a uniform thickness along the second direction Y. The separation pattern SP may have a bottom surface lower than the top surface of the third device isolation pattern 3m. Other configurations may be identical or similar to those discussed above with reference to FIGS. 1 and 2.

The semiconductor device of FIG. 24B may be manufactured as follows. In the steps of FIGS. 11 and 12, when a removal process is performed on the first preliminary capping pattern CP12 exposed to the second opening OP2 and on the first preliminary metal-containing pattern MG12 below the exposed first preliminary capping pattern CP12, the spacer 10 and the first interlayer dielectric layer 20 exposed to the second opening OP2 may also be removed to expose the top surface of the third device isolation pattern 3m below the first preliminary metal-containing pattern MG12. In this case, the separation region SR may be provided thereon with a separation groove GS whose shape is transferred from that of the second opening OP2. When viewed in plan, the separation groove GS may have a linear shape extending along the second direction Y. A separation pattern SP may be formed in the separation groove GS.

Figure 25:
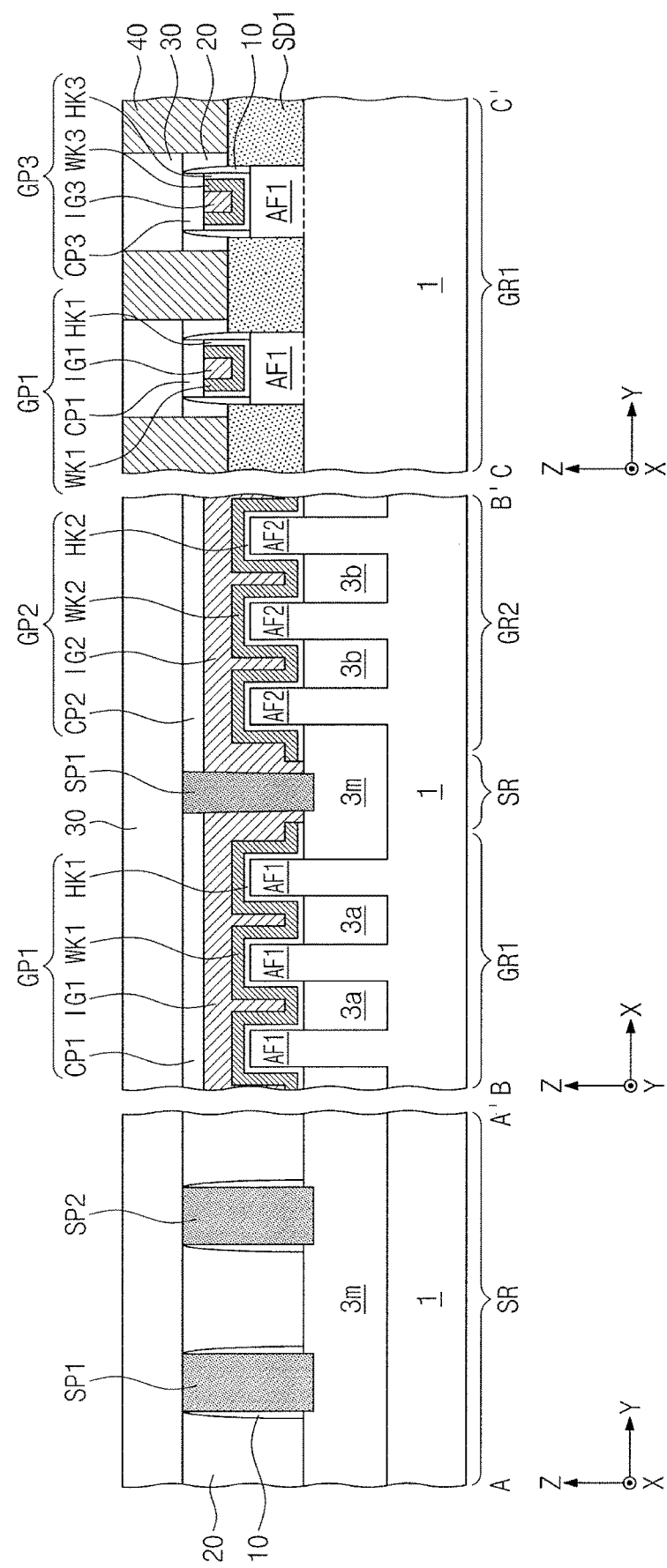
FIG. 25 illustrates a cross-sectional view along lines A-A', B-B', C-C' of FIG. 1, according to other example embodiments.

FIG. 25 illustrates a cross-sectional view taken along lines A-A', B-B', C-C' of FIG. 1, according to some example embodiments.

Referring to FIG. 25, the first gate pattern GP1 may include a first high-k dielectric pattern HK1, a first work function pattern WK1, a first metal line pattern IG1, and a first capping pattern CP1. The second gate pattern GP2 may include a second high-k dielectric pattern HK2, a second work function pattern WK2, a second metal line pattern IG2, and a second capping pattern CP2.

Each of the first and second work function patterns WK1 and WK2 may be an N-type work function pattern or a P-type work function pattern. The N-type work function pattern may include one or more of lanthanum (La), lanthanum oxide (LaO), tantalum (Ta), tantalum nitride (TaN), niobium (Nb), and titanium nitride (TiN). The P-type work function pattern may include one or more of aluminum (Al), aluminum oxide ($Al_2O_3$), titanium nitride (TiN), tungsten nitride (WN), and ruthenium oxide ($RuO_2$). The first and second metal line patterns IG1 and IG2 may include one or more of tungsten, copper, and aluminum.

In a cross-section taken along line B-B' in FIG. 25, the first work function pattern WK1 may have a sidewall aligned with that of the first high-k dielectric pattern HK1. The first metal line pattern IG1 may be in contact with the sidewall of the first high-k dielectric pattern HK1 and the sidewall of the first work function pattern WK1. The sidewall of the first high-k dielectric pattern HK1 and the sidewall of the first work function pattern WK1 may be spaced apart from the first separation pattern SP1. The second work function pattern WK2 may have a sidewall aligned with that of the second high-k dielectric pattern HK2. The second metal line pattern IG2 may be in contact with the sidewall of the second high-k dielectric pattern HK2 and the sidewall of the second work function pattern WK2. The sidewall of the second high-k dielectric pattern HK2 and the sidewall of the second work function pattern WK2 may be spaced apart from the second separation pattern SP2. Other configurations may be identical or similar to those discussed above with reference to FIG. 2.

The semiconductor device of FIG. 25 may be manufactured as follows. In the step of FIG. 7, a work function layer may be conformally formed on the high-k dielectric layer HK, and in the step of FIG. 9, the work function layer may be cut when the high-k dielectric layer HK is cut on the separation region SR. As like that shown in FIG. 10, a metal line layer may be formed on the work function layer and the high-k dielectric layer HK, and then the processes discussed above with reference to FIGS. 11 and 12 may be subsequently performed.

Figure 26:
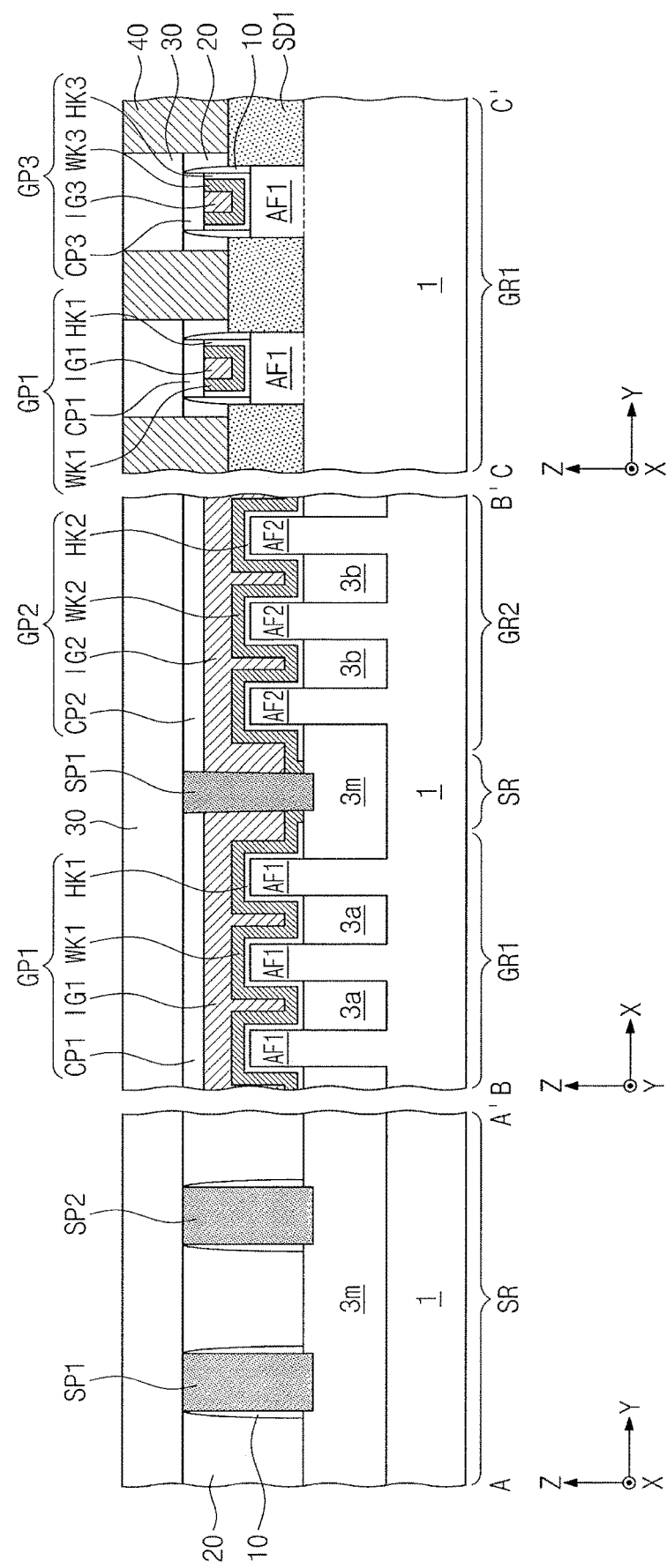
FIG. 26 illustrates a cross-sectional view along lines A-A', B-B', C-C' of FIG. 1, according to other example embodiments.

FIG. 26 illustrates a cross-sectional view taken along lines A-A', B-B', C-C' of FIG. 1, according to some example embodiments.

Referring to FIG. 26, the first gate pattern GP1 may include the first high-k dielectric pattern HK1, the first work function pattern WK1, the first metal line pattern IG1, and the first capping pattern CP1. The second gate pattern GP2 may include the second high-k dielectric pattern HK2, the second work function pattern WK2, the second metal line pattern IG2, and the second capping pattern CP2. In a cross-section taken along line B-B' in FIG. 26, the first work function pattern WK1 may have a sidewall in contact with the first high-k dielectric pattern HK1. The first separation pattern SP1 may be in contact with the sidewall of the first work function pattern WK1, and may be spaced apart from the first high-k dielectric pattern HK1. The second work function pattern WK2 may have a sidewall in contact with the second high-k dielectric pattern HK2. The second separation pattern SP2 may be in contact with the sidewall of the second work function pattern WK2, and may be spaced apart from the second high-k dielectric pattern HK2. Other configurations may be identical or similar to those discussed above with reference to FIG. 2. The structure of FIG. 26 may be formed when the metal-containing layer MG is replaced with a double layer that includes, e.g., consists of, the work function layer and the metal line layer.

Figure 27:
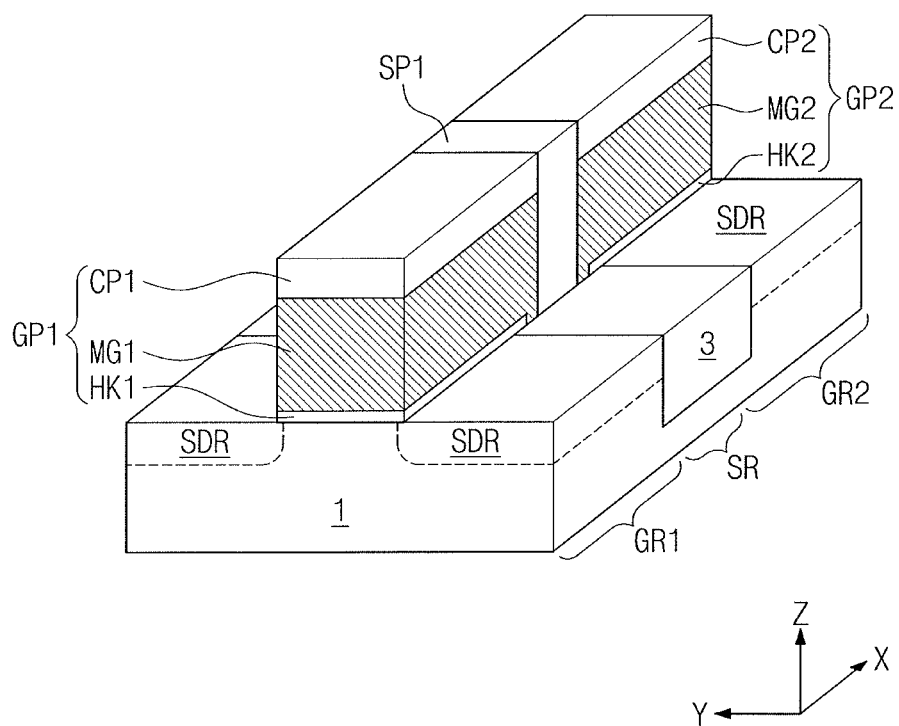
FIG. 27 illustrates a perspective view of a semiconductor device according to example embodiments.

FIG. 27 illustrates a perspective view showing a semiconductor device according to some example embodiments.

Referring to FIG. 27, a semiconductor substrate 1 may be provided that includes a first gate region GR1, a second gate region GR2, and a separation region SR between the first and second gate regions GR1 and GR2. A device isolation pattern 3 may be disposed in the semiconductor substrate 1 on the separation region SR. A first gate pattern GP1 may be disposed on the semiconductor substrate 1 on the first gate region GR1, and a second gate pattern GP2 may be disposed on the semiconductor substrate 1 on the second gate region GR2. On the separation region SR, the semiconductor substrate 1 may be provided thereon with a first separation pattern SP1 that separates the first and second gate patterns GP1 and GP2 from each other. The first gate pattern GP1 may include a first high-k dielectric pattern HK1, a first metal-containing pattern MG1, and a first capping pattern CP1 that are sequentially stacked. The second gate pattern GP2 may include a second high-k dielectric pattern HK2, a second metal-containing pattern MG2, and a second capping pattern CP2 that are sequentially stacked. The first separation pattern SP1 may be spaced apart from all of the first and second high-k dielectric patterns HK1 and HK2. The semiconductor substrate 1 may be provided therein with source/drain regions SDR each of which is adjacent to a corresponding one of the first and second gate patterns GP1 and GP2. The source/drain region SDR may be doped with P-type or N-type impurities. A semiconductor device according to the present embodiment may include no active fins AF1 and AF2 of FIG. 2. In addition, in the semiconductor device according to the present embodiment, the first and second high-k dielectric patterns HK1 and HK2 may not extend onto sidewalls of the first and second metal-containing patterns MG1 and MG2. Although not shown, the first gate pattern GP1, the second gate pattern GP2, and the first separation pattern SP1 may have their sidewalls covered with spacers.

The semiconductor device of FIG. 27 may be manufactured as follows. A semiconductor substrate 1 may be prepared to include a first gate region GR1, a second gate region GR2, and a separation region SR between the first and second gate regions GR1 and GR2. A device isolation pattern 3 may be formed in the semiconductor substrate 1 on the separation region SR. A high-k dielectric layer may be formed on an entire surface of the semiconductor substrate 1 and then removed from the separation region SR, which removal may form a first high-k dielectric pattern HK1 and a second high-k dielectric pattern HK2 on the first gate region GR1 and the second gate region GR2, respectively. In this step, shapes of the first and second high-k dielectric patterns HK1 and HK2 may be determined by partial removal of the high-k dielectric layer from the first and second gate regions GR1 and GR2. A metal-containing layer and a capping layer may be sequentially formed on the entire surface of the semiconductor substrate 1 and then patterned to form a first metal-containing pattern MG1, a second metal-containing pattern MG2, a first capping pattern CP1, and a second capping pattern CP2. Therefore, a first gate pattern GP1 and a second gate pattern GP2 may be formed. An ion implantation process may be performed to form source/drain regions SDR.

Figure 28:
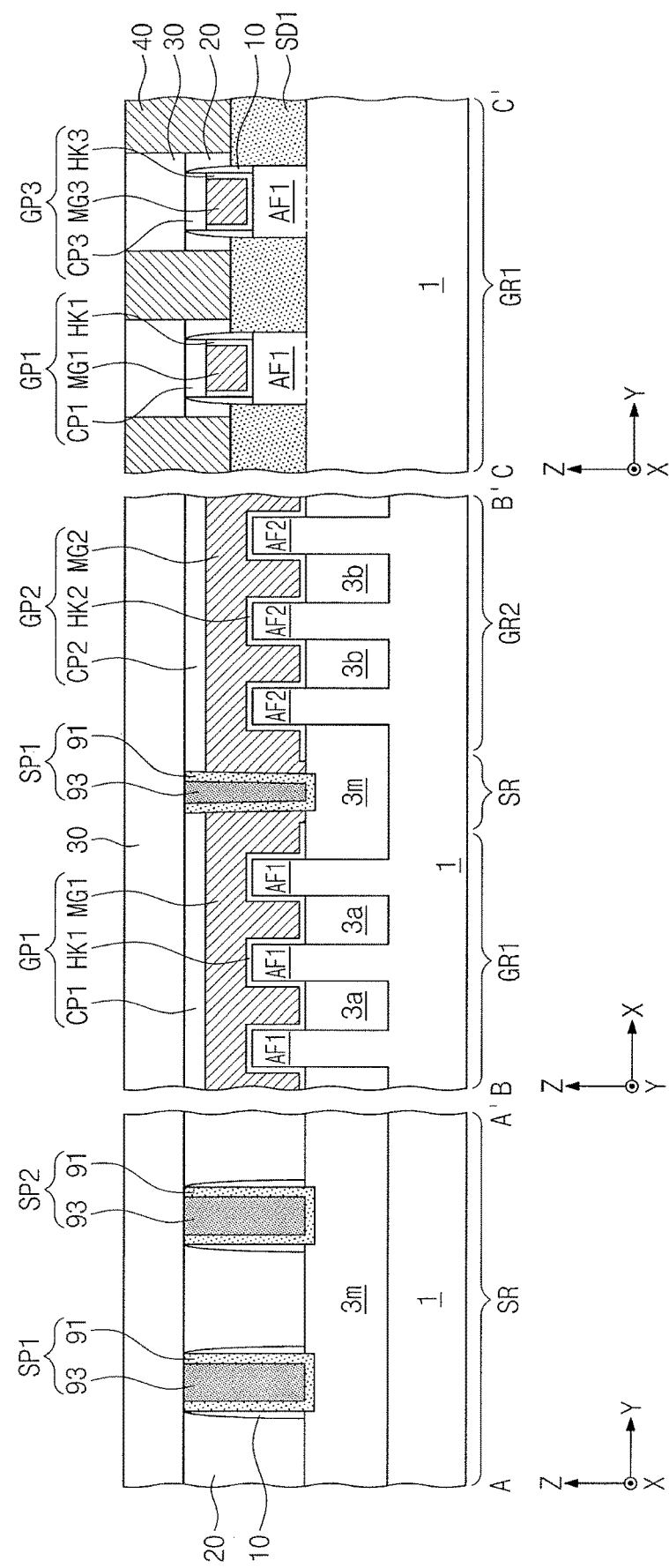
FIG. 28 illustrates a cross-sectional view along lines A-A', B-B', C-C' of FIG. 1, according to other example embodiments.

FIG. 28 illustrates a cross-sectional view taken along lines A-A', B-B', C-C' of FIG. 1, according to some example embodiments.

Referring to FIG. 28, each of the first and second separation patterns SP1 and SP2 may include a first separation dielectric layer 91 and a second separation dielectric layer 93. The first separation dielectric layer 91 may have a different material from that of the second separation dielectric layer 93. For example, one of the first and second separation dielectric layers 91 and 93 may be a silicon oxide layer, and the other of the first and second separation dielectric layers 91 and 93 may be a silicon nitride layer. The first separation dielectric layer 91 may cover a bottom surface and a sidewall of the second separation dielectric layer 93. Each of the first and second separation patterns SP1 and SP2 may have a double-layered structure composed of different dielectric layers as shown in FIG. 29, but alternatively may have a triple- or more-layered structure. Each of the first and second separation patterns SP1 and SP2 may include an air gap or a seam.

According to embodiments, a semiconductor device may improve in reliability. In a method of manufacturing a semiconductor device according to embodiments, because the removal of a high-k dielectric layer occurs before removal of a metal-containing layer from a separation region, the separation of gate patterns may be accomplished to prevent bridge or short between the gate patterns. In such case, a cutting failure may be prevented because no residues of the high-k dielectric layer are left on the gate cutting region. As a result, the semiconductor may improve in reliability, decrease in defect rate, and increase in manufacturing yield.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    first active fins that protrude from a substrate;
    second active fins that protrude from the substrate and are spaced apart from the first active fins;
    a device isolation pattern between the first active fins and the second active fins, the device isolation pattern including a recess in a portion of an upper surface of the device isolation pattern;
    a first gate pattern that crosses over the first active fins;
    a second gate pattern that crosses over the second active fins; and
    a separation pattern between the first gate pattern and the second gate pattern,
    wherein the first gate pattern includes a first high-k dielectric pattern, a first work function pattern on the first high-k dielectric pattern, a first metal line pattern on the first work function pattern, and a first gate capping pattern on the first metal line pattern,
    wherein a sidewall of the first work function pattern is aligned with a lower sidewall of the first high-k dielectric pattern,
    wherein the first metal line pattern is in contact with the sidewall of the first work function pattern,
    wherein the separation pattern extends into the recess to contact a bottom surface of the recess and is spaced apart from the first work function pattern, and
    wherein a sidewall of the separation pattern is in contact with the device isolation pattern, the first metal line pattern, and the first gate capping pattern.

2. The semiconductor device of claim 1, wherein the first high-k dielectric pattern includes an upper sidewall that is offset from the lower sidewall, the first work function pattern being in contact with the upper sidewall, and the first metal line pattern being in contact with the lower sidewall.

3. The semiconductor device of claim 1, wherein a first distance between one of the first active fins that is most adjacent to the second gate pattern and one of the second active fins that is most adjacent to the first gate pattern is greater than a second distance between the first active fins that are adjacent to each other.

4. The semiconductor device of claim 1, wherein a bottom surface of the separation pattern is lower than a top surface of the device isolation pattern.

5. The semiconductor device of claim 1, further comprising a gate spacer covering a second sidewall of the separation pattern.

6. The semiconductor device of claim 1, wherein the second gate pattern includes a second high-k dielectric pattern, a second work function pattern on the second high-k dielectric pattern, and a second metal line pattern on the second work function pattern,
wherein a sidewall of the second work function pattern is aligned with a lower sidewall of the second high-k dielectric pattern,
wherein the second metal line pattern is in contact with the sidewall of the second work function pattern,
wherein the separation pattern is spaced apart from the second work function pattern, and
wherein the second high-k dielectric pattern extends to contact a sidewall of the second metal line pattern.

7. A semiconductor device, comprising:
a first gate pattern and a second gate pattern on a substrate, the first gate pattern and the second gate pattern being spaced apart from each other; and
a separation pattern that separates the first gate pattern and the second gate pattern from each other,
wherein the first gate pattern includes:
a first high-k dielectric pattern;
a first work function pattern on the first high-k dielectric pattern; and
a first metal line pattern on the first work function pattern,
wherein the first work function pattern is in contact with a lower sidewall of the first high-k dielectric pattern, and
wherein the separation pattern is in contact with the first work function pattern and is not in direct contact with the first high-k dielectric pattern, and
wherein the second gate pattern includes a second high-k dielectric pattern, a second work function pattern on the second high-k dielectric pattern, and a second metal line pattern on the second work function pattern,
wherein the second work function pattern is in contact with a lower sidewall of the second high-k dielectric pattern, and
wherein the separation pattern is in contact with the second work function pattern.

8. The semiconductor device of claim 7, wherein the first high-k dielectric pattern includes an upper sidewall that is offset from the lower sidewall, the first work function pattern being in contact with the upper sidewall.

9. The semiconductor device of claim 7, wherein the first gate pattern further includes a first gate capping pattern on the first metal line pattern, the first gate capping pattern being in direct contact with a sidewall of the separation pattern.

10. The semiconductor device of claim 7, wherein the first gate pattern and the second gate pattern are elongated in a first direction and are on an imaginary straight line.

11. The semiconductor device of claim 7, further comprising:
first active fins that protrude from the substrate, wherein the first gate pattern crosses over the first active fins, and the first high-k dielectric pattern being conformal on the first active fins;
second active fins that protrude from the substrate and are spaced apart from the first active fins, wherein the second gate pattern crosses over the second active fins; and
a device isolation pattern between the first active fins and the second active fins, the device isolation pattern including a recess on its upper portion.

12. The semiconductor device of claim 11, wherein the separation pattern is in contact with a bottom surface of the recess.

* * * * *